United States Patent
Valero et al.

(10) Patent No.: US 10,454,454 B2
(45) Date of Patent: Oct. 22, 2019

(54) PARTITIONED BLOCK FREQUENCY DOMAIN ADAPTIVE FILTER DEVICE COMPRISING ADAPTATION MODULES AND CORRECTION MODULES

(71) Applicant: Fraunhofer-Gesellschaft zur Förderung der angewandten Forschung e.V., München (DE)

(72) Inventors: Maria Luis Valero, Nürnberg (DE); Emanuel Habets, Spardorf (DE); Edwin Mabande, Großenseebach (DE); Anthony Lombard, Erlangen (DE); Dirk Mahne, Nürnberg (DE); Bernhard Birzer, Schwandorf (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 0 days.

(21) Appl. No.: 15/878,234

(22) Filed: Jan. 23, 2018

(65) Prior Publication Data
US 2018/0226954 A1    Aug. 9, 2018

Related U.S. Application Data

(63) Continuation of application No. PCT/EP2016/067653, filed on Jul. 25, 2016.

(30) Foreign Application Priority Data

Jul. 28, 2015  (EP) .................................... 15178698

(51) Int. Cl.
*G06F 17/10* (2006.01)
*H03H 21/00* (2006.01)

(52) U.S. Cl.
CPC .... *H03H 21/0067* (2013.01); *H03H 21/0027* (2013.01); *H03H 21/0043* (2013.01); *H03H 2021/0058* (2013.01)

(58) Field of Classification Search
None
See application file for complete search history.

(56) References Cited

U.S. PATENT DOCUMENTS

| | | | |
|---|---|---|---|
| 7,171,436 B2 * | 1/2007 | Egelmeers | H03H 21/0027 708/322 |
| 7,292,661 B1 | 11/2007 | Chan et al. | |

(Continued)

FOREIGN PATENT DOCUMENTS

| | | |
|---|---|---|
| JP | 2004-507923 A | 3/2004 |
| JP | 2004-349796 A | 12/2004 |

(Continued)

OTHER PUBLICATIONS

S. Haykin: "Adaptive Filter Theory"; 4th ed. Prentice-Hall; 2002 (38 pages).

(Continued)

*Primary Examiner* — David H Malzahn
(74) *Attorney, Agent, or Firm* — Haynes and Boone, LLP

(57) ABSTRACT

A partitioned block frequency domain adaptive filter device includes a frequency domain adaptive filter configured for filtering a frequency domain representation of a time domain input signal depending on a set of filter coefficients consisting of a plurality of blocks of filter coefficients in order to produce a filtered signal; a plurality of parallel arranged filter update blocks; wherein each of the filter update blocks includes an adaptation module configured for executing an adaptation sequence including the steps of calculating an approximation of a constrained gradient update for the filter coefficients of the respective block of filter coefficients, and calculating a cumulative error introduced on the uncon- (Continued)

strained gradient update; wherein each of the filter update blocks includes a correction module configured for executing a correction sequence including the steps of calculating a corrected constrained gradient update for the filter coefficients of the respective block of filter coefficients.

12 Claims, 13 Drawing Sheets

(56) References Cited

U.S. PATENT DOCUMENTS

| | | | | |
|---|---|---|---|---|
| 2002/0073128 | A1* | 6/2002 | Egelmeers | H03H 17/0461 708/322 |
| 2002/0166016 | A1* | 11/2002 | Stoodley | G06F 9/44521 710/200 |
| 2004/0015529 | A1* | 1/2004 | Tanrikulu | H04B 3/23 708/322 |
| 2004/0132416 | A1 | 7/2004 | Yee | |
| 2010/0142604 | A1* | 6/2010 | Azenkot | H04B 3/23 375/229 |
| 2018/0226954 | A1* | 8/2018 | Valero | H03H 21/0027 |

FOREIGN PATENT DOCUMENTS

| | | |
|---|---|---|
| JP | 2010-045804 A | 2/2010 |
| JP | 2010-288174 A | 12/2010 |
| RU | 2180984 C2 | 3/2002 |
| RU | 2302707 C2 | 7/2007 |
| WO | WO 02/17488 A1 | 2/2002 |

OTHER PUBLICATIONS

A. Oppenheim et al.: "Digital Signal Processing" (Chapter 8 The Discrete Fourier Transform pp. 541-628); 2nd ed. Prentice-Hall Inc.; 1993 (88 pages).

J. Benesty et al.: "Frequency-domain adaptive filtering revisited, generalization to the multi-channel case, and application to acoustic echo cancellation"; Proc. IEEE ICASSP; vol. 2; pp. 289-292; 2000 (4 pages).

P. C. W. Sommen: "Partitioned frequency-domain adaptive filters"; Proc. Asilomar Conf. on Signals, Systems and Computers; pp. 677-681; 1989 (5 pages).

J. S. Soo et al.: "Multidelay block frequency domain adaptive filter"; IEEE Trans. Acoust., Speech, Signal Process.; vol. 38; pp. 373-376; Feb. 1990 (4 pages).

M. Joho et al.: "Connecting partitioned frequency-domain filters in parallel or in cascade"; IEEE Trans. Circuits Syst. II; vol. 47; No. 8; pp. 685-697; Aug. 2000 (14 pages).

M. A. Izbal et al.: "A novel normalized cross-correlation based echo-path change detector"; IEEE Region 5 Conference; pp. 249-251; Apr. 2007 (4 pages).

D. Mansour et al.: "Unconstrained Frequency-Domain Adaptive Filter", IEEE Trans. Acoust., Speech, Signal Process.; vol. ASSP-30, No. 5; pp. 726-734; Oct. 1982 (9 pages).

J.J. Shynk: "Frequency-Domain and Multirate Adaptive Filtering", IEEE SP Magazine; pp. 14-37; Jan. 1992 (24 pages).

Office Action dated Mar. 5, 2019 in the parallel Japanese patent application No. 2018-504634 (8 pages with English translation).

Office Action dated Dec. 3, 2018 issued in the parallel Russian patent application No. 2018107046 (6 pages with English translation).

Search Report accompanying the Office Action dated Dec. 3, 2018 issued in the parallel Russian patent application No. 2018107046 (4 pages with English translation).

* cited by examiner

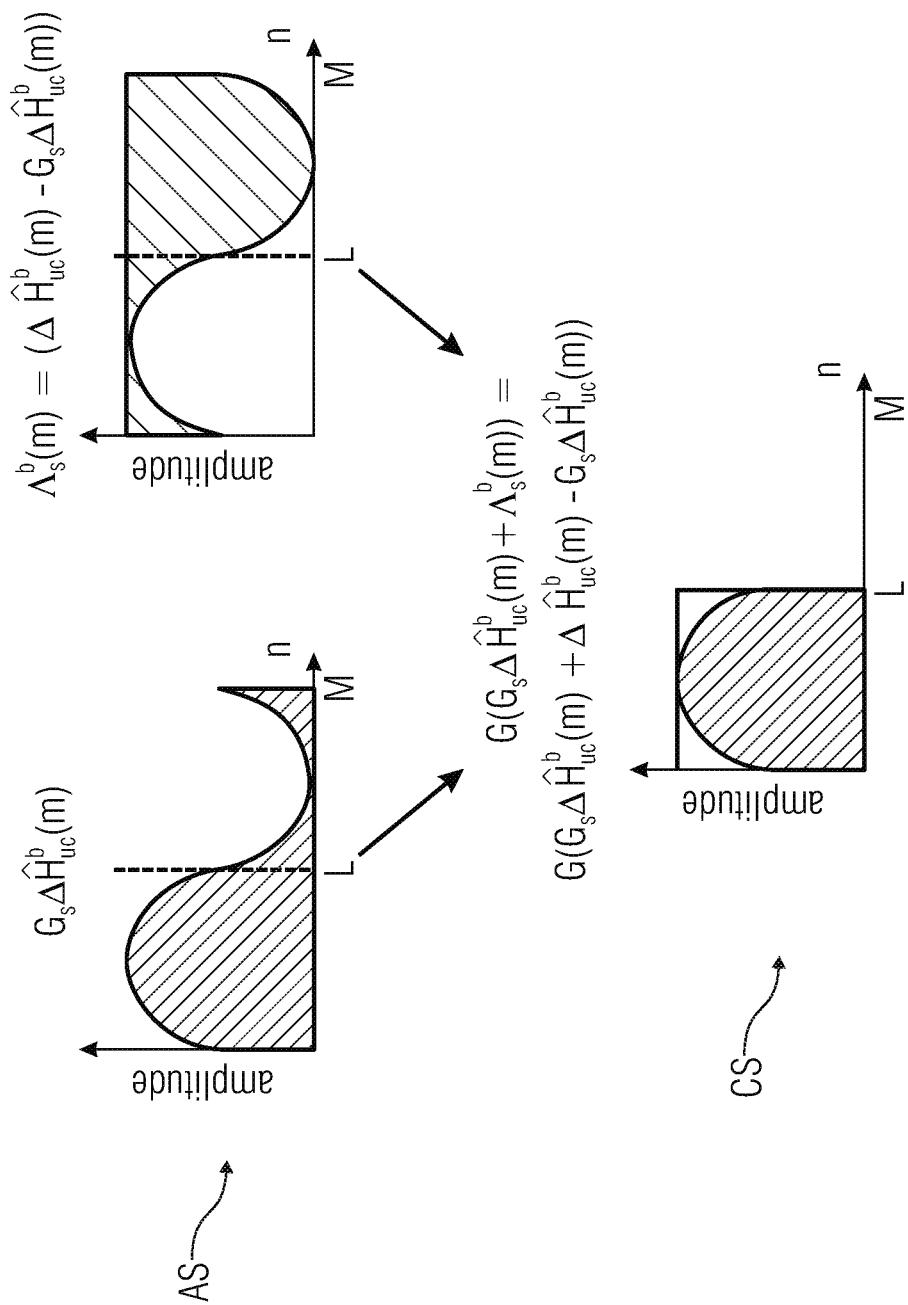

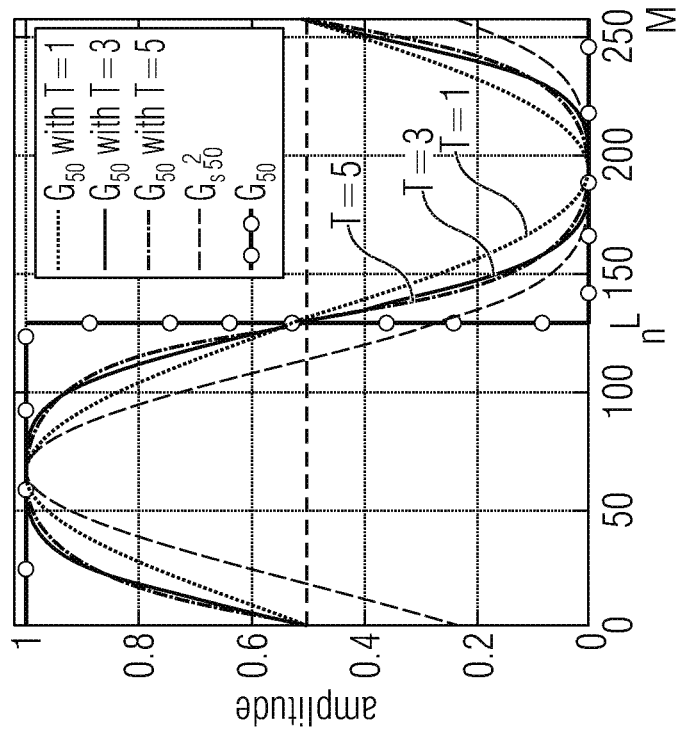
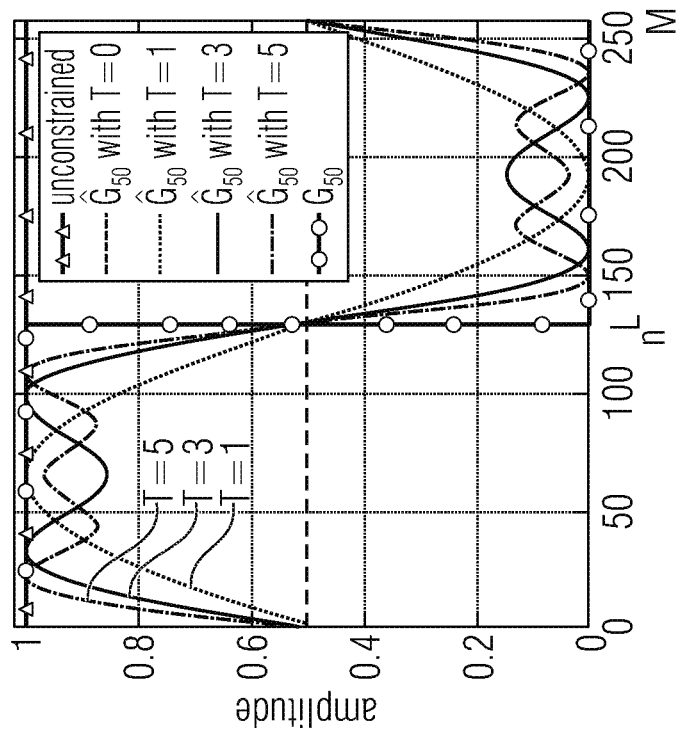
FIG. 6A
FIG. 6B

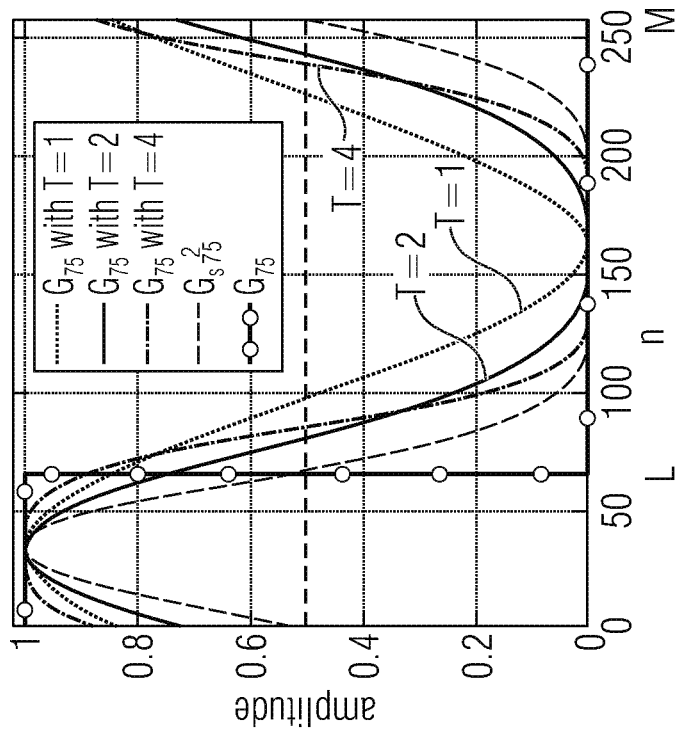
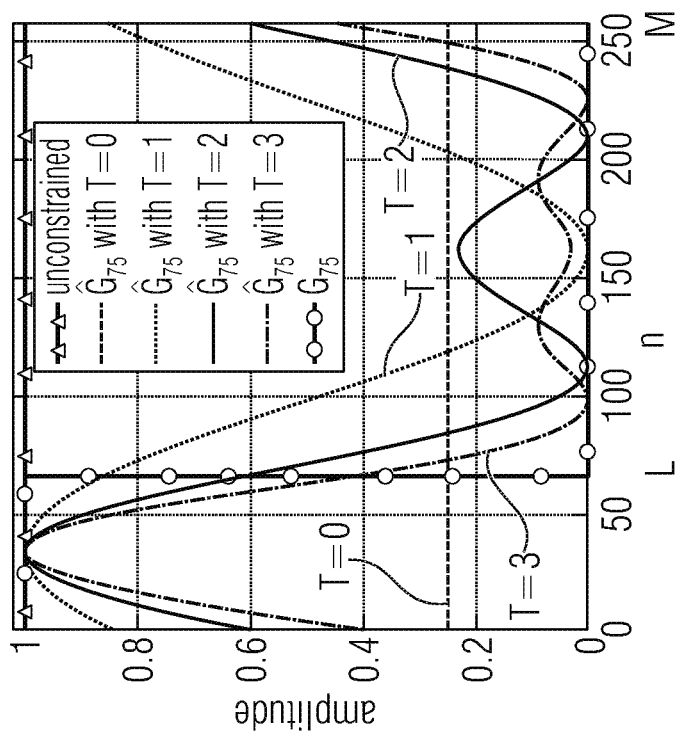

PARTITIONED BLOCK FREQUENCY DOMAIN ADAPTIVE FILTER DEVICE COMPRISING ADAPTATION MODULES AND CORRECTION MODULES

CROSS-REFERENCES TO RELATED APPLICATIONS

This application is a continuation of co-pending International Application No. PCT/EP2016/067653, filed Jul. 25, 2016, which is incorporated herein by reference in its entirety, and additionally claims priority from European Application No. EP 15178698.5, filed Jul. 28, 2015, which is incorporated herein by reference in its entirety.

The invention refers to a partitioned block frequency domain adaptive filter device. In particular, the invention refers to a novel constraining concept for partitioned block frequency domain adaptive filter (PBFDAF) devices.

BACKGROUND OF THE INVENTION

Partitioned block frequency domain adaptive filter devices are known, for example, from "Partitioned Block frequency domain adaptive filter," Dutch European Patent PCT/EP2001/009625, Aug. 13, 2001, hereinafter referred to as "reference [10]". One disadvantage of devices according to reference [10] is their high complexity.

SUMMARY

According to an embodiment, a partitioned block frequency domain adaptive filter device may have: a frequency domain adaptive filter configured for filtering a frequency domain representation of a time domain input signal depending on a set of filter coefficients consisting of a plurality of blocks of filter coefficients in order to produce a filtered signal; a plurality of parallel arranged filter update blocks, each of the filter update blocks being configured for updating one of the blocks of filter coefficients based on an update signal gathered by a circular correlation of a block of the frequency domain representation signal and a frequency domain control signal including a representation of the filtered signal; wherein each of the filter update blocks includes an adaptation module configured for executing an adaptation sequence which may have the steps of: calculating an approximation of a constrained gradient update for the filter coefficients of the respective block of filter coefficients by applying an approximated constraining matrix having a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient update by applying the approximated constraining matrix to the unconstrained gradient update; wherein each of the filter update blocks includes a correction module configured for executing a correction sequence which may have the steps of: calculating a corrected constrained gradient update for the filter coefficients of the respective block of filter coefficients by applying the constraining matrix to a sum of the approximation of the constrained gradient update and the cumulative error.

According to another embodiment, a device for cancelling an echo signal of a time domain input signal may have: a partitioned block frequency domain adaptive filter device; the partitioned block frequency domain adaptive filter device may have: a frequency domain adaptive filter configured for filtering a frequency domain representation of the time domain input signal depending on a set of filter coefficients consisting of a plurality of blocks of filter coefficients in order to produce a filtered signal; a frequency domain to time domain converter configured for converting the filtered signal into an estimated echo signal representing an estimation of the echo signal in time domain; a subtraction module for producing an output signal by subtracting the estimated echo signal from a signal-to-be-processed including the echo signal; a plurality of parallel arranged filter update blocks, each of the filter update blocks being configured for updating one of the blocks of filter coefficients based on an update signal gathered by a circular correlation of a block of the frequency domain representation signal and a frequency domain control signal including a representation of the filtered signal; wherein each of the filter update blocks includes an adaptation module configured for executing an adaptation sequence which may have the steps of: calculating an approximation of a constrained gradient update for the filter coefficients of the respective block of filter coefficients by applying an approximated constraining matrix having a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update; wherein each of the filter update blocks includes a correction module configured for executing a correction sequence which may have the steps of: calculating a corrected constrained gradient update for the filter coefficients of the respective block of filter coefficients by applying the constraining matrix to a sum of the approximation of the constrained gradient update and the cumulative error.

According to another embodiment, an adaptive filtering method may have the steps of: using a frequency domain adaptive filter for filtering a frequency domain representation of a time domain input signal depending on a set of filter coefficients consisting of a plurality of blocks of filter coefficients in order to produce a filtered signal; using each filter update block of a plurality of parallel arranged filter update blocks for updating one of the blocks of filter coefficients based on an update signal gathered by a circular correlation of a block of the frequency domain representation signal and a frequency domain control signal including a representation of the filtered signal; executing an adaptation sequence for each of the filter update blocks by using an adaptation module of the respective filter update block, the adaptation sequence may have the steps of: calculating an approximation of the constrained gradient update for the filter coefficients of the respective block of filter coefficients by applying an approximated constraining matrix having a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update; executing a correction sequence for each of the filter update blocks by using a correction module of the respective filter update block, the correction sequence may have the steps of: calculating a corrected constrained gradient update for the filter coefficients of the respective block of filter coefficients by applying the frequency domain constraining matrix to a sum of the approximation of the constrained gradient update and the cumulative error.

According to another embodiment, a non-transitory digital storage medium may have a computer program stored thereon to perform the inventive adaptive filtering method, when said computer program is run by a computer.

The constraining matrix is the frequency domain equivalent of applying a rectangular window function to a circular correlation of a block in the time domain, to select only the linear components, which may be defined as:

$$g(n) = \begin{cases} 1 & \text{if } n < N \\ 0 & \text{if } M > n \geq N \end{cases}.$$

wherein n is the time index, M is the length of the discrete Fourier transform (DFT) and N is the number of filter coefficients in a block.

Following the analysis provided in reference [4], the elements of the constraining matrix, G, may be defined in the following way:

$$G(k, k') = \frac{1}{M} \sum_{n=0}^{N-1} W_M^{(k-k')n} = \frac{1}{M} \frac{1 - W_M^{(k-k')N}}{1 - W_M^{(k-k')}} = \frac{1}{M} \frac{1 - e^{-j2\pi(k-k')N/M}}{1 - e^{-j2\pi(k-k')/M}},$$

with G(k, k')=N/M if k=k'; where k and k' are the discrete frequency indices and $W_M = e^{(-j2\pi/M)}$ is the DFT basis function.

The term approximated constraining matrix refers to any approximation of the constraining matrix in the frequency domain which has the same number of columns and rows as the constraining matrix but a lower complexity as the constraining matrix. The reduction of complexity may be, in particular, achieved by setting some of the elements to zero.

The invention reduces the complexity of partitioned block frequency domain adaptive filter devices by simplifying the constraining operation. In contrast to other previously proposed devices, the device according to the invention allows to reduce the complexity without noticeably reducing the convergence rate of the adaptive filtering, it is flexible in terms of the design parameters and it is fully parallelizable, as it corrects the approximation of the gradient update of one block based only on the cumulative error of that block.

The partitioned block frequency domain adaptive filter device according to the invention may be used for acoustic echo cancellation. Furthermore, the invention can be used to reduce the complexity of any partitioned block frequency domain adaptive filter device independently of a specific application. More precisely, it may be used in other applications such as system identification, noise reduction, channel equalization, etc.

According to an advantageous embodiment of the invention the partitioned block frequency domain adaptive filter device comprises a correction sequence control module configured for deciding whether and at which of the filter update blocks the correction sequence is applied after executing the adaptation sequence.

According to an advantageous embodiment of the invention the correction sequence control module is configured for deciding whether and at which of the filter update blocks the correction sequence is applied based on the cumulative errors of the filter update blocks.

According to an advantageous embodiment of the invention the correction sequence control module comprises a correction scheme defining for each of the filter update blocks a number of adaptation sequences after which the correction sequence is applied at the respective filter partition.

According to an advantageous embodiment of the invention for each of the filter update blocks the number of adaptation sequences after which the correction sequence is applied at the respective filter partition is diminished in response to a change of the frequency domain control signal which exceeds a threshold.

According to an advantageous embodiment of the invention for each of the filter update blocks the number of adaptation sequences after which the correction sequence is applied at the respective filter partition is dynamically adapted based on a measure of the frequency domain control signal.

According to an advantageous embodiment of the invention the partitioned block frequency domain adaptive filter device comprises an approximated constraining matrix update module configured for dynamically adapting the complexity of the approximated constraining matrix.

According to an advantageous embodiment of the invention the approximated constraining matrix update module is configured for dynamically adapting the complexity of the approximated constraining matrix depending on a measure of the frequency domain control signal.

According to an advantageous embodiment of the invention the approximated constraining matrix update module is configured for enlarging the complexity of the approximated constraining matrix in response to a change of the frequency domain control signal which exceeds a threshold.

In a further aspect the invention provides a device for cancelling an echo signal of a time domain input signal. The device comprises a partitioned block frequency domain adaptive filter device, the partitioned block frequency domain adaptive filter device comprising: a frequency domain adaptive filter configured for filtering a frequency domain representation of the time domain input signal depending on a set of filter coefficients consisting of a plurality of blocks of filter coefficients in order to produce a filtered signal; a frequency domain to time domain converter configured for converting the filtered signal into an estimated echo signal representing an estimation of the echo signal in time domain; a subtraction module for producing an output signal by subtracting the estimated echo signal from a signal-to-be-processed comprising the echo signal; a plurality of parallel arranged filter update blocks, each of the filter update blocks being configured for updating one of the blocks of filter coefficients based on an update signal gathered by a circular correlation of a block of the frequency domain representation signal and a frequency domain control signal comprising a representation of the filtered signal; wherein each of the filter update blocks comprises an adaptation module configured for executing an adaptation sequence comprising the steps of calculating an approximation of the constrained gradient update for the filter coefficients of the respective block of filter coefficients by applying an approximated constraining matrix having a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update; wherein each of the filter update blocks comprises a correction module configured for executing a correction sequence comprising the steps of calculating a corrected constrained gradient update for the filter coefficients of the respective block of filter coefficients by applying the constraining matrix to a sum of the approximation of the constrained gradient update and the cumulative error.

In a further aspect the invention provides an adaptive filtering method comprising the steps of: using a frequency domain adaptive filter for filtering a frequency domain representation signal of a time domain input signal depending on a set of filter coefficients consisting of a plurality of blocks of filter coefficients in order to produce a filtered signal; using each filter update partition of a plurality of parallel arranged filter update blocks for updating one of the blocks of filter coefficients based on an update signal gathered by a circular correlation of a block of the frequency domain representation signal and a frequency domain control signal comprising a representation of the filtered signal; executing an adaptation sequence for each of the filter update blocks by using an adaptation module of the respective filter update block, the adaptation sequence comprising the steps of calculating an approximation of the constrained gradient update for the filter coefficients of the respective block of filter coefficients by applying an approximated constraining matrix having a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update; executing a correction sequence for each of the filter update blocks by using a correction module of the respective filter update block, the correction sequence comprising the steps of calculating a corrected constrained gradient update for the filter coefficients of the respective block of filter coefficients by applying the frequency domain constraining matrix to a sum of the approximation of the constrained gradient update and the cumulative error.

Computer program for adaptive filtering, when running on a processor, executing the inventive method.

BRIEF DESCRIPTION OF THE DRAWINGS

Embodiments of the present invention will be detailed subsequently referring to the appended drawings, in which:

FIG. 5 illustrates a constraining operation according to the invention in a schematic view;

FIGS. 6A & 6B provides examples of time domain constraining windows corresponding to different constraining matrices, wherein a window overlap of 50% is assumed;

FIGS. 7A & 7B provides examples of time domain constraining windows corresponding to different constraining matrices, wherein a window overlap of 75% is assumed;

DETAILED DESCRIPTION OF THE INVENTION

Prior to the description of the new features of the invention, first some insight in the problems presented by performing the convolutions in the discrete Fourier transform domain (DFT domain) and a description of the constraining operation will be given. This will be followed by a formulation of the problem of frequency domain adaptive filters and their partitioned block based implementation in the specific context of acoustic echo cancellation (AEC).

Acoustic echo cancellation is used to cope with the electro acoustic coupling between loudspeakers and microphones in, for example, hands free communication scenarios. The electro acoustic coupling is the result of the loudspeaker, or far-end, signal being propagated through the room and acquired by the microphone. As a consequence, the microphone signal does not only contain the desired near-end speech and background noise, but also the acoustic echo signal. Acoustic echo cancelers use adaptive filter algorithms, see for example references [1] and [2], to identify the acoustic echo path which may be used for estimating the acoustic echo signal. The estimated echo is then subtracted from the microphone signal prior to transmission.

Figure 1:
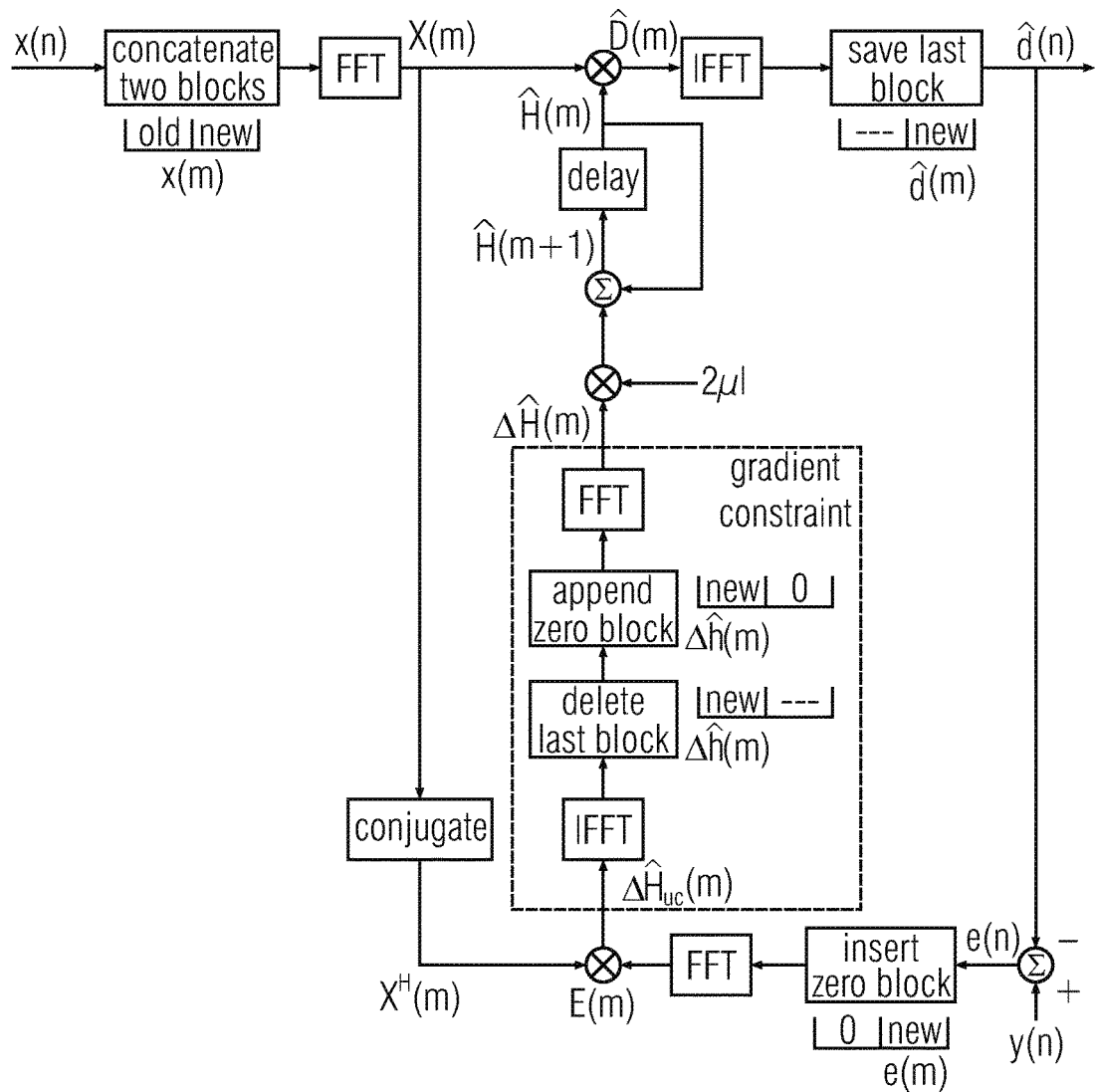
FIG. 1 provides an overview of a general structure of a frequency domain adaptive filter (FDAF) device according to conventional technology in a schematic view, taken from J. J. Shynk, "Frequency-domain and multirate adaptive filtering," IEEE Signal Process. Mag., vol. 9, no. 1, pp. 14-37, January 1992; hereinafter referred to as "reference [1]"

FIG. 1 provides an overview of a general structure of a frequency domain adaptive filter (FDAF) device according to reference [1]. Frequency domain adaptive filter devices provide a lower algorithmic complexity compared to their time domain counterparts due to the fact that the convolutions (and correlations) are calculated in the DFT domain. However, a convolution or a correlation performed in the DFT domain corresponds to a circular convolution, or correlation, of length M, M being the length of the DFT, in the time domain, see A. Oppenheim and R. W. Schafer, Digital Signal Processing, 2nd ed. Prentice-Hall Inc., Englewood Cliff, N J, 1993; hereinafter referred to as "reference [3]", i.e., $$A(m)B(m) \xleftrightarrow{DFT} a(m) \circledM b(m) \quad (1)$$

$$A(m)B^H(m) \xleftrightarrow{DFT} a(m) \circledM b(-m) \quad (2)$$

where m is the discrete frame index, $\circledM$ denotes circular convolution of length M and the superscript $(\cdot)^H$ denotes Hermitian transpose. In the remainder the following notation is used, bold letters are used for vectors and underlined bold letters for square matrices. Capital letters are used for denoting variables in the DFT domain. As in the following the focus is set on the correlations performed in the DFT domain, the constraining operation for a circular correlation will be described. The time domain circular correlation is defined by, see reference [3], $$a(m) \circledS b(-m) = \sum_{n=0}^{M-1} a(n)b(((m+n))_M), \quad (3)$$

where n denotes the discrete time index and $((\cdot))_M$ denotes M modulo operation. If it is assumed that the length of a(m) is M and that b(m) is of length L<M, in reference [3] only the first M−L+1 coefficients coincide with the linear correlation, while the last L−1 taps are the result of the wrap-around. As described in reference [1], the outcome of the circular correlation can be linearized by selecting only the linear coefficients and setting the rest of the coefficients to zero. This procedure is denoted as constraining operation.

The general structure of a FDAF algorithm using the overlap-save (OLS) method is depicted in FIG. 1, taken from reference [1]. It may be mentioned that the overlap-add (OLA) method could also be used, but for brevity only the OLS will be described. The notation used in the problem formulation is as follows, x(n) is the input or far-end signal which is propagated through the near-end room, d(n)=x(n)*h(n) is the echo signal and y(n)=d(n)+r(n) is the signal acquired by the microphone—which, in this context, is considered to be disturbed by the near-end signal, which may be denoted as s(n), and background noise, which may be denoted as v(n), so that r(n)=s(n)+v(n). The acoustic echo path between the loudspeaker and microphone, denoted by h(n), is modeled as a finite impulse response filter (FIR filter) of length L. The adaptive algorithm is used to identify h(n), which may be used for obtaining the estimated echo signal, $\hat{d}(n)$, where the superscript denotes ^ estimation.

In reference [1] it is stressed that the error signal, which drives the adaptive algorithm, should be calculated in the time-domain, i.e., $e(n) = y(n) - \hat{d}(n)$ or be perfectly constrained if calculated in the DFT domain. Hereafter, throughout this document the terms 'constrained' and 'unconstrained' only refer to the gradient update, $\Delta \hat{H}(m)$, which is the result of a correlation computed in the DFT domain. The adaptive filter is updated by $$\hat{H}(m+1) = \hat{H}(m) + DFT\{\underline{g}IDFT\{\underline{\mu}(m)\underline{X}^H(m)E(m)\}\} \quad (4)$$
$$= \hat{H}(m) + DFT\{\underline{g}IDFT\{\Delta\hat{H}_{uc}(m)\}\} = \hat{H}(m) + \Delta\hat{H}(m),$$

where m is the time frame index and $\underline{g}$=diag{g} is a diagonal matrix with the elements of g, g is a time domain window which eliminates the undesired components in the unconstrained gradient update, $\Delta \hat{H}_{uc}(m)$, on its main diagonal. Following the OLS method definition in reference [1], the DFT domain input signal is $\underline{X}(m)$=diag{DFT{x(m)}} and the error signal is denoted by $E(m) = DFT\{[0_{1 \times L}, e^T(m)]^T\}$, with $$x(m)=[x(mR-M+1), \ldots x(mR)]T \text{ and } e(m)=[e(mR-V+1), \ldots e(mR)]T,$$

respectively; where R is the frame shift, the input signal has the same length as the DFT and V>R is the length of the error signal. In addition, the gradient update, $\Delta \hat{H}(m)$, already includes the step-size matrix, $\underline{\mu}(m)$, for compactness. In order to obtain L linear taps of the filter update, the length of the DFT has to be M≥L+V−1. The OLS and OLA methods described in reference [1] are defined for V=L, and hence M=2L is chosen as an even length fast Fourier transform (FFT) can be more efficiently implemented as an odd one. Given the definition of X(m) and E(m), the resulting $\Delta \hat{H}_{uc}(m)$ will contain L+1 linear components and M−L−1=V−1 wrap-around components. However, for consistency $\hat{H}(m)$ is defined as, $$\hat{H}(m) = DFT\{[\hat{h}^T(m), 0_{1 \times V}]^T\}, \quad (5)$$

where it can be observed that the estimated echo path vector, $$\hat{h}(m) = [\hat{h}_m(0), \ldots \hat{h}_m(L-1)]^T, \quad (6)$$

has to be zero-padded, and the length of the zero padding is V. The wrap-around components are usually eliminated in the time domain, as depicted in FIG. 1, however it is also possible to select the linear components by multiplying the unconstrained filter update by a constraining matrix in the frequency domain, $$\Delta \hat{H}(m) = DFT\{\underline{g} \cdot IDFT\{\Delta \hat{H}_{uc}(m)\}\} =$$
$$\underline{F}\underline{g}\underline{F}^{-1}\Delta \hat{H}_{uc}(m) = \underline{G}\Delta \hat{H}_{uc}(m), \quad (7)$$

where $\underline{F}$ is the M×M DFT matrix and $\underline{G}=\underline{F}\underline{g}\underline{F}^{-1}$ is the frequency domain constraining matrix. In order to analyze the structure of $\underline{G}$, first the constraining window in the time domain has to be defined $$g(n) = \begin{cases} 1 & \text{if } n < L \\ 0 & \text{if } M > n \geq L \end{cases}. \quad (8)$$

Hereafter, following the analysis provided in J. Benesty and D. R. Morgan, "Frequency-domain adaptive filtering revisited, generalization to the multichannel case, and application to acoustic echo cancellation," in Proc. IEEE ICASSP, vol. 2, pp. 289-292, 2000; hereinafter referred to as "reference [4]", the elements of the constraining matrix, G, are $$G(k, k') = \frac{1}{M}\sum_{n=0}^{L-1} W_M^{(k-k')n} = \frac{1}{M}\frac{1-W_M^{(k-k')L}}{1-W_M^{(k-k')}} = \frac{1}{M}\frac{1-e^{-j2\pi(k-k')L/M}}{1-e^{-j2\pi(k-k')/M}}, \quad (9)$$

with G(k, k')=L/M if k=k'; where k and k' are the discrete frequency indices and $W_M = e^{(-j2\pi/M)}$ is the DFT basis function. The latter expression highlights the fact that the operation is equivalent to a frequency domain to frequency domain transform (similar to a decimation operation). It is possible to deduce from (9) that if the relation L/M is sufficiently large, the main diagonal of G will be dominant. In addition, if M is sufficiently large, the values on the off-diagonals will decay fast and towards negligible values, see reference [4].

Figure 2:
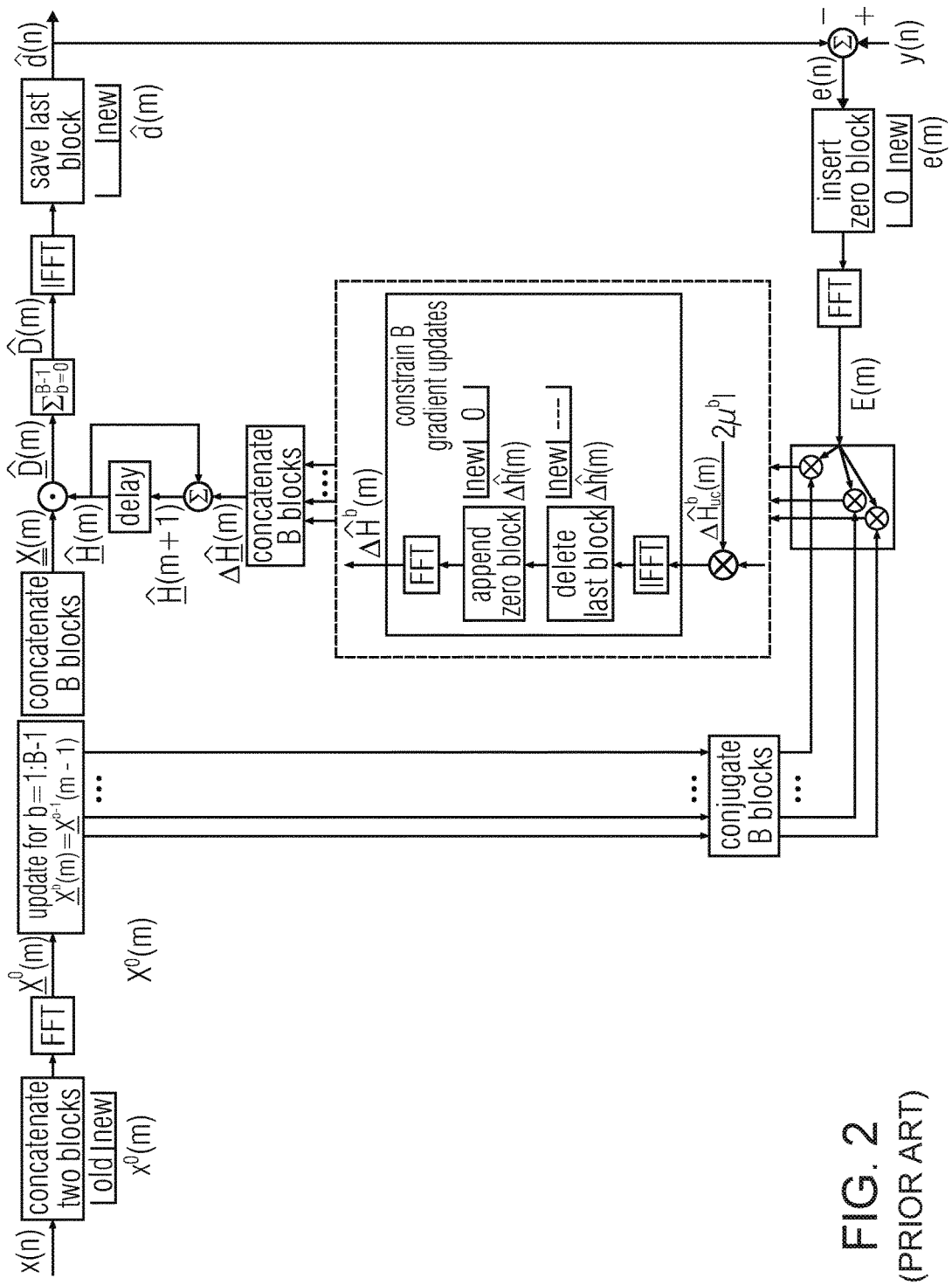
FIG. 2 provides an overview of a general structure of a frequency domain adaptive filter (PBFDAF) device according to conventional technology in a schematic view.

FIG. 2 shows an example of a partitioned block frequency domain adaptive filter device. The partitioned block based formulation of a FDAF, first proposed in P. C. W. Sommen, "Partitioned frequency-domain adaptive filters," in Proc. Asilomar Conf. on Signals, Systems and Computers, pp. 677-681, 1989; hereinafter referred to as "reference [5]", provides a lower algorithmic delay as a non-partitioned FDAF implementation. In order to reduce the delay, the adaptive filter is partitioned into B blocks of length N=ceil (L/B), hence, $$\hat{h}^b(m) = [\hat{h}_m(bN), \ldots \hat{h}_m(bN+N-1)]^T, \quad (10)$$

where b denotes the block index. The DFT length can now also be reduced, thus, using the OLS method, to obtain N linear coefficients the input signal frames have to be of length M≥N+V−1, where V is the length of the error signal and of the zero padding of h(m) (as already defined for the FDAF problem formulation). Hereafter, a block of input signal is defined as, $$x^b(m) = [x(mR-bN-M+1), \ldots, x(mR-bN)]^T, \quad (11)$$

and the error signal is obtained by subtracting from the microphone signal the estimated echo, which is obtained as the sum over all the contributions per block, $\hat{D}^b(m) = \underline{X}^b(m)\hat{H}^b(m)$, i.e., $$[0_{1 \times N}, e^T(m)]^T = [0_{1 \times N}, y^T(m)]^T - [0_{1 \times N}, \hat{d}^T(m)]^T \quad (12)$$

$$= [0_{1 \times N}, y^T(m)]^T - \tilde{g} \cdot IDFT\left\{\sum_{b=0}^{B-1} \underline{X}^b(m)\hat{H}^b(m)\right\}$$

with $$\tilde{g}(n) = \begin{cases} 0 & \text{if } n < N \\ 1 & \text{if } M > n \geq N \end{cases} \text{ and}$$

$$a(m) = [a(mR - V + 1), \ldots, a(mR)]^T, \text{ with } a \in (e, y, \tilde{d})$$

where $\tilde{g}$ is the window needed to linearize a circular convolution, which, in the remainder, is assumed to be perfectly applied. Finally, the update of one block of the adaptive filter is described by $$\hat{H}^b(m+1) = \hat{H}^b(m) + \mu(m)G$$
$$\underline{X}^{bH}(m)E(m) = \hat{H}^b(m) + G\Delta\hat{H}_{uc}^b(m). \quad (13)$$

It is obvious that now the length of the FFT's is reduced, but 2B FFT's have to be performed per frame to correctly linearize the circular correlations. In some applications it is desirable or useful to further reduce the complexity of the partitioned block based adaptive algorithms, and the most straightforward possibility is to reduce the number of transforms per frame by omitting the constraining operation. Another possibility is to simplify the frequency domain constraining matrix, G. Yet, these simplifications usually come at the cost of a loss of performance of the PB-FDAF algorithm.

On one hand, if the non-partitioned problem formulation is used only one IFFT and one FFT per frame are needed, whose length is usually sufficiently long to enable the omission of the constraining operation without noticeably impairing the performance. The omission of the constraining operation is usually denoted as unconstrained method. On the other hand, if a partitioned block based formulation is used, the length of the FFTs is reduced. Consequently, the error introduced by omitting the constraining operations becomes non-negligible, as this error increases with decreasing M—which is related to the decrease rate of the values on the off-diagonals of G.

In the past, several methods were proposed to reduce the complexity of the PB-FDAF algorithms without impairing the performance. These methods will be shortly described in the following. However, first it may be mentioned that the constraining operation per block can be performed in two ways, i.e.

$$\hat{H}^b(m+1) = \hat{H}^b(m) + G\Delta\hat{H}^b(m) \quad (14)$$

$$\hat{H}^b(m+1) = G(\hat{H}^b(m) + \Delta\hat{H}^b(m)) \quad (14)$$

where (14) can be interpreted as coping with the wrap-around errors before adaptation and (15) after adaptation. If the constraining matrix G is used without any simplification, both expressions are mathematically equal, but are the result of different implementations.

Some of the previously proposed methods to reduce the algorithmic complexity of the PBFDAF algorithms are the unconstrained FDAF and PBFDAF, D. Mansour and A. J. Gray, Jr, "Unconstrained frequency-domain adaptive filter," IEEE Trans. Acoust., Speech, Signal Process., vol. 30, no. 5, pp. 726-734, October 1982; hereinafter referred to "reference [6]" and J. S. Soo and K. K. Pang, "Multidelay block frequency domain adaptive filter," IEEE Trans. Acoust., Speech, Signal Process., vol. 38, pp. 373-376, February 1990; hereinafter referred to as "reference [7]"

the alternative unconstrained PBFDAF, reference [7]

the alternated constraining method, M. Joho and G. S. Moschytz, "Connecting partitioned frequency-domain filters in parallel or in cascade," IEEE Trans. Circuits Syst. II, vol. 47, no. 8, pp. 685-697, August 2000; hereinafter referred to as "reference [8]"

the modified alternated constraining method, R. M. M. Derkx, G. P. M. Engelmeers, and P. C. W. Sommen, "New constraining method for partitioned block frequency-domain adaptive filters," IEEE Trans. Signal Process., vol. 50, no. 3, pp. 2177-2186, 2002; hereinafter referred to as "reference [9]".

The aim of all these methods, as well as of the invention, is to reduce the total number of FFTs per frame. The previously mentioned unconstrained method as proposed in references [6] and [7], directly omits the constraining operation, i.e.

$$\hat{H}^b(m+1) = \hat{H}^b(m) + \Delta\hat{H}^b(m), \forall b. \quad (16)$$

It can also be applied as proposed in reference [4], $$\hat{H}^b(m+1) = \hat{H}^b(m) + G_{uc}\Delta\hat{H}^b(m), \forall b. \quad (17)$$

where, $$G_{uc} = \frac{N}{M} I_{M \times M}$$

is a scaled identity matrix, which is equivalent to considering only the main diagonal of G. The alternative unconstrained method proposed in reference [7], alternatively constrains one block per frame using (14). However, these three methods constantly accumulate the wrap-around errors in the updated filter coefficients, which reduce the convergence speed.

The alternated constraining method uses (15) on top of the unconstrained algorithm, as proposed reference [8]. By doing this, the accumulated wrap-around errors between corrections are eliminated. This method allows for a further complexity reduction, which can be achieved if the frame interval between corrections P, is enlarged. The filter is then updated in two steps, $$\hat{H}^b(m+1) = \hat{H}^b(m) + \Delta\hat{H}_{uc}^b(m); b = 0:B-1 \quad (18a)$$

$$\hat{H}^{b_c}(m+1) = G\hat{H}^{b_c}(m+1)b_c((m/P))_B, \quad (18b)$$

where block $b_c$ will only be corrected if the result of $((m/P))_B \in \mathbb{N}^0$, i.e. is a non-negative natural number.

In reference [9] the modified alternated constraining method is proposed which is based on the alternated constraining method and is also applied in two steps, adaptation and correction. The main novelty of the method described in references [9] and [10] is that it uses an approximation of the constraining window g to reduce the wrap-around components per block in the adaptation step. The proposed approximation of the constraining window in [9] is $$G_s(k, k') = \begin{cases} 1/2 & \text{if } k = k' \\ -j/4 & \text{if } k = k' - 1 \\ j/4 & \text{if } k = k' + 1 \end{cases} \quad (19)$$

for a 50% overlap. The resulting window in the time domain is an elevated sine window, which is able to reduce the wrap-around errors. However, the linear coefficients are also modified and have to be compensated for in the correction step, in which also the remaining wrap-around errors are eliminated.

The modified alternated constraining method uses the wrap-around components of the previous and posterior blocks, in [10] denoted as adjacent blocks, to compensate the errors introduced on the linear coefficients of one block. Hence, it is useful to correct two blocks to be able to completely compensate the linear components of one block; as a consequence the first and final blocks are not completely compensated for.

Figure 3:
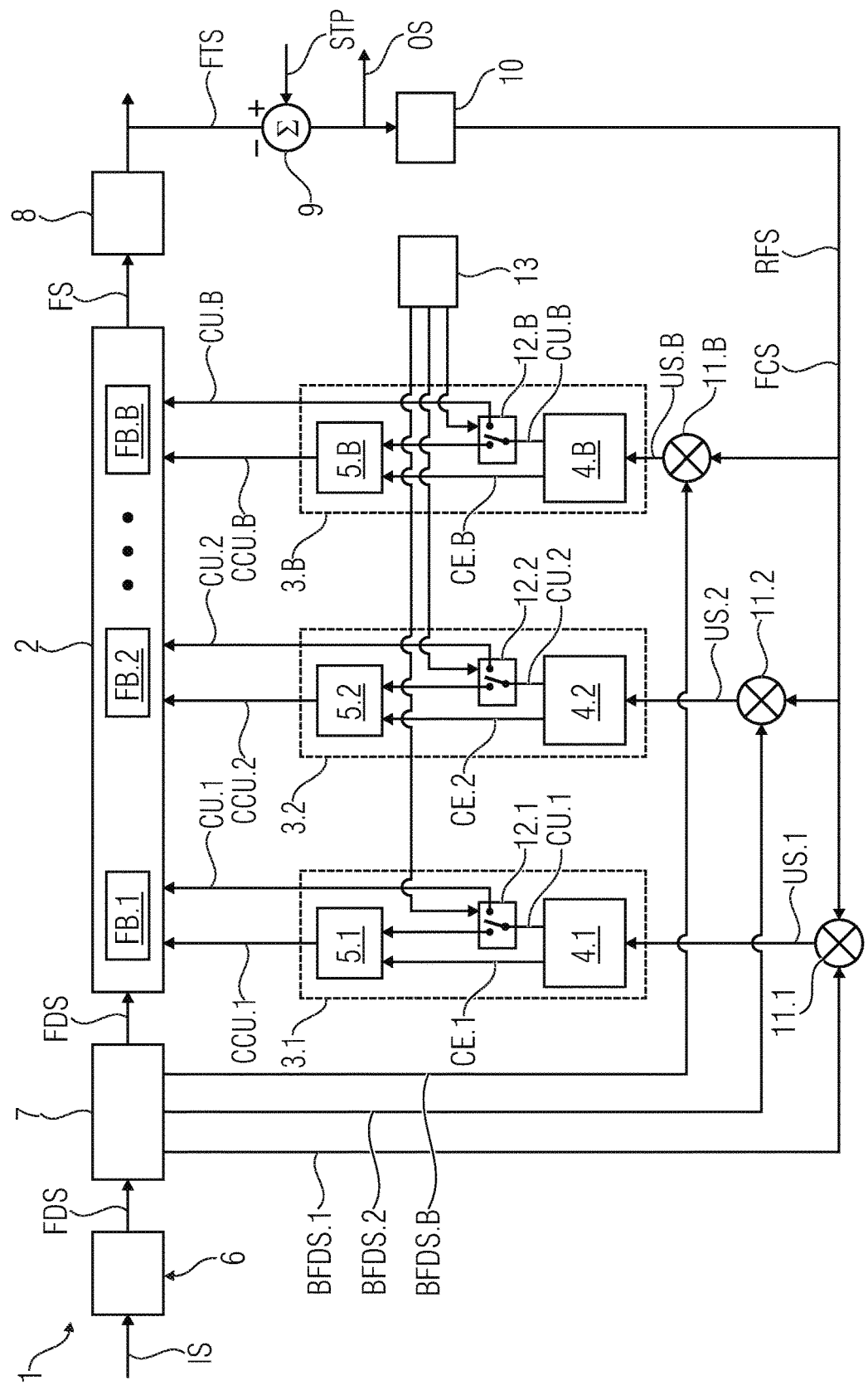
FIG. 3 illustrates a first embodiment of a partitioned block frequency domain filter device according to the invention in a schematic view.

FIG. 3 illustrates a first embodiment of a partitioned block frequency domain filter device 1 according to the invention in a schematic view.

The partitioned block frequency domain adaptive filter device 1 comprises: a frequency domain adaptive filter 2 configured for filtering a frequency domain representation FDS of a time domain input signal IS depending on a set of filter coefficients consisting of a plurality of blocks FB.1, FB.2, FB.B of filter coefficients in order to produce a filtered signal FS; a plurality of parallel arranged filter update blocks 3.1, 3.2, 3.B, each of the filter update blocks 3.1, 3.2, 3.B being configured for updating one of the blocks FB.1, FB.2, FB.B of filter coefficients based on an update signal US.1, US.2, US.B gathered by a circular correlation of a block BFDS.1, BFDS.2, BFDS.B of the frequency domain representation signal FDS and a frequency domain control signal FCS comprising a representation RFS of the filtered signal FS; wherein each of the filter update blocks 3.1, 3.2, 3.B comprises an adaptation module 4.1, 4.2, 4.B configured for executing an adaptation sequence AS (see FIG. 5) comprising the steps of calculating an approximation of a constrained gradient update CU.1, CU.2, CU.B for the filter coefficients of the respective block FB.1, FB.2, FB.B of filter coefficients by applying an approximated constraining matrix ACM (see FIG. 12) having a lesser complexity than a constraining matrix FCM to an unconstrained gradient update for the filter coefficients of the respective block of filter coefficients, wherein the unconstrained gradient update is derived from the update signal US.1, US.2, US.B, and calculating a cumulative error CE.1, CE.2, CE.B introduced on the unconstrained gradient update by applying the approximated constraining matrix ACM to the unconstrained gradient update; wherein each of the filter update blocks 3.1, 3.2, 3.B comprises a correction module 5.1, 5.2, 5.B configured for executing a correction sequence CS (see FIG. 5) comprising the steps of calculating a corrected constrained gradient update CCU.1, CCU.2, CCU.B for the filter coefficients of the respective block FB.1, FB.2, FB.B of filter coefficients by applying the frequency domain constraining matrix FCM to a sum of the constrained gradient update CU.1, CU.2, CU.B and the cumulative error CE.1, CE.2, CE.B.

The partitioned block frequency domain adaptive filter device 1 functions as follows: the time domain input signal IS is converted into a frequency domain representation signal FDS by time domain to frequency domain converter 6. A block processor 7 extracts blocks BFDS.1, BFDS.2, BFDS.B of the frequency domain representation signal FDS, which are conjugated to obtain the conjugated blocks BFDS'.1, BFDS'.2, BFDS'.B, which may be used for calculating a correlation in the DFT domain. The frequency domain representation signal FDS is converted by the frequency domain adaptive filter to into a filtered signal FS in frequency domain, wherein blocks FB.1, FB.2, FB.B of filter coefficients are used. The filtered signal FS is then transformed by frequency domain to time domain converter 8 into a time domain filtered signal FTS. Afterwards the time domain filtered signal FTS is subtracted from a signal-to-be-processed STP by subtraction module 9. The so produced output signal OS is converted back into a frequency domain by a time domain to frequency domain converter 10, which outputs a frequency domain control signal FCS which comprises the representation RFS of the filtered signal FS.

The circular correlation module 11.1 executes a circular correlation by multiplying the frequency domain control signal FCS and the conjugated block BFDS'.1 of the frequency domain representation signal FDS in order to produce the update signal US.1. In the same way the circular correlation module 11.2 executes a circular correlation by multiplying the frequency domain control signal FCS and the conjugated block BFDS'.2 of the frequency domain representation signal FDS in order to produce the update signal US.2. Similarly the circular correlation module 11.B executes a circular correlation by multiplying the frequency domain control signal FCS and the conjugated block BFDS'.B of the frequency domain representation signal FDS in order to produce the update signal US.B.

Each of the update signals US.1, US.2 and US.B is fed to one of the adaptation modules 4.1, 4.2, 4.B. Each of the adaptation modules calculates an approximation of the constrained gradient update CU.1, CU.2, CU.B and a cumulative error CE.1, CE.2, CE.B. The cumulative errors CE.1, CE.2, CE.B are forwarded to the correction modules 5.1, 5.2, 5.B whereas the approximation of the constrained gradient updates CU.1, CU.2, CU.B may be forwarded alternatively to the correction modules 5.1, 5.2, 5.B or to the blocks FB.1, FB.2, FB.B of filter coefficients by switching the respective switch of the switches 12.1, 12.2, 12.B.

According to an advantageous embodiment of the invention the partitioned block frequency domain adaptive filter device 1 comprises a correction sequence control module 13 configured for deciding whether and at which of the filter update blocks 3.1, 3.2, 3.B the correction sequence CS is applied after executing the adaptation sequence AS.

In a further aspect the invention provides an adaptive filtering method comprising the steps of: using a frequency domain adaptive filter 2 for filtering a frequency domain representation FDS of a time domain input signal depending on a set of filter coefficients consisting of a plurality of blocks FB.1, FB.2, FB.B of filter coefficients in order to produce a filtered signal FS; using each filter update block 3.1, 3.2, 3.B of a plurality of parallel arranged filter update blocks 3.1, 3.2, 3.B for updating one of the blocks FB.1, FB.2, FB.B of filter coefficients based on an update signal US.1, US.2, US.B gathered by a circular correlation of a block BFDS.1, BFDS.2, BFDS.B of the frequency domain representation signal FDS and a frequency domain control signal FCS comprising a representation RFS of the filtered signal FS; executing an adaptation sequence AS for each of the filter update blocks 3.1, 3.2, 3.B by using an adaptation module 4.1, 4.2, 4.B of the respective filter update block 3.1, 3.2, 3.B, the adaptation sequence AS comprising the steps of calculating an approximation of a constrained gradient update CU.1, CU.2, CU.B for the filter coefficients of the respective block FB.1, FB.2, FB.B of filter coefficients by applying an approximated constraining matrix ACM having a lesser complexity than a constraining matrix FCM to an unconstrained gradient update for the filter coefficients of the respective block of filter coefficients, wherein the unconstrained gradient update is derived from the update signal US.1, US.2, US.B, and calculating a cumulative error CE.1, CE.2, CE.B introduced on the unconstrained gradient by applying the approximated constraining matrix ACM to the unconstrained gradient update; executing a correction sequence CS for each of the filter update blocks 3.1, 3.2, 3.B by using a correction module 5.1, 5.2, 5.B of the respective filter update block 3.1, 3.2, 3.B, the correction sequence CS comprising the steps of calculating a corrected constrained gradient update CCU.1, CCU.2, CCU.B for the filter coefficients of the respective block FB.1, FB.2, FB.B of filter coefficients by applying the constraining matrix FCM to a sum of the approximation of the constrained gradient update CU.1, CU.2, CU.B and the cumulative error CE.1, CE.2, CE.B.

In another aspect the invention provides a computer program for adaptive filtering, when running on a processor, executing the method according to the invention.

Figure 4A:
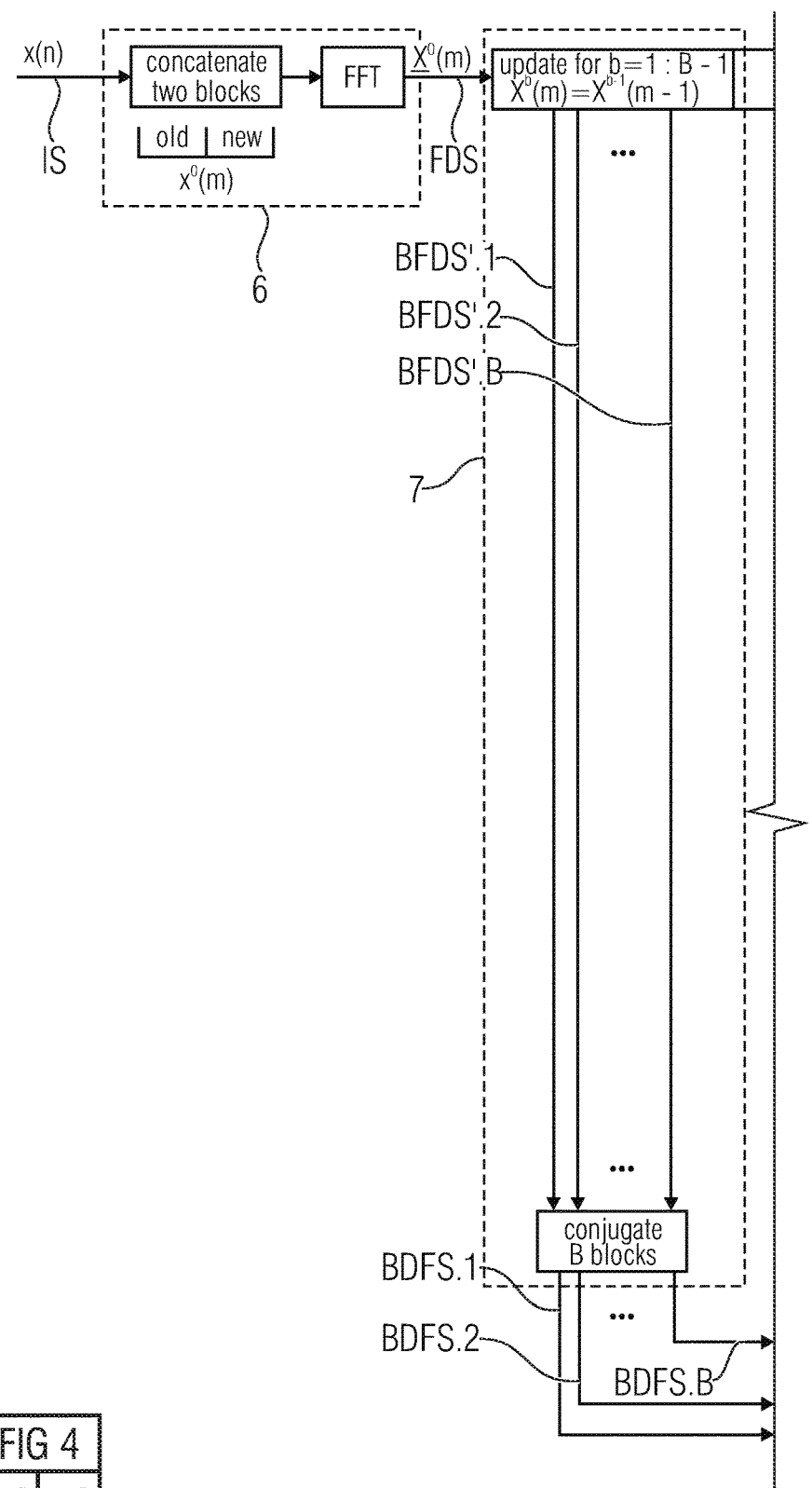
FIG. 4 consists of FIG. 4A and FIG. 4B and illustrates a second embodiment of a partitioned block frequency domain filter device according to the invention in a schematic view.
Figure 4B:
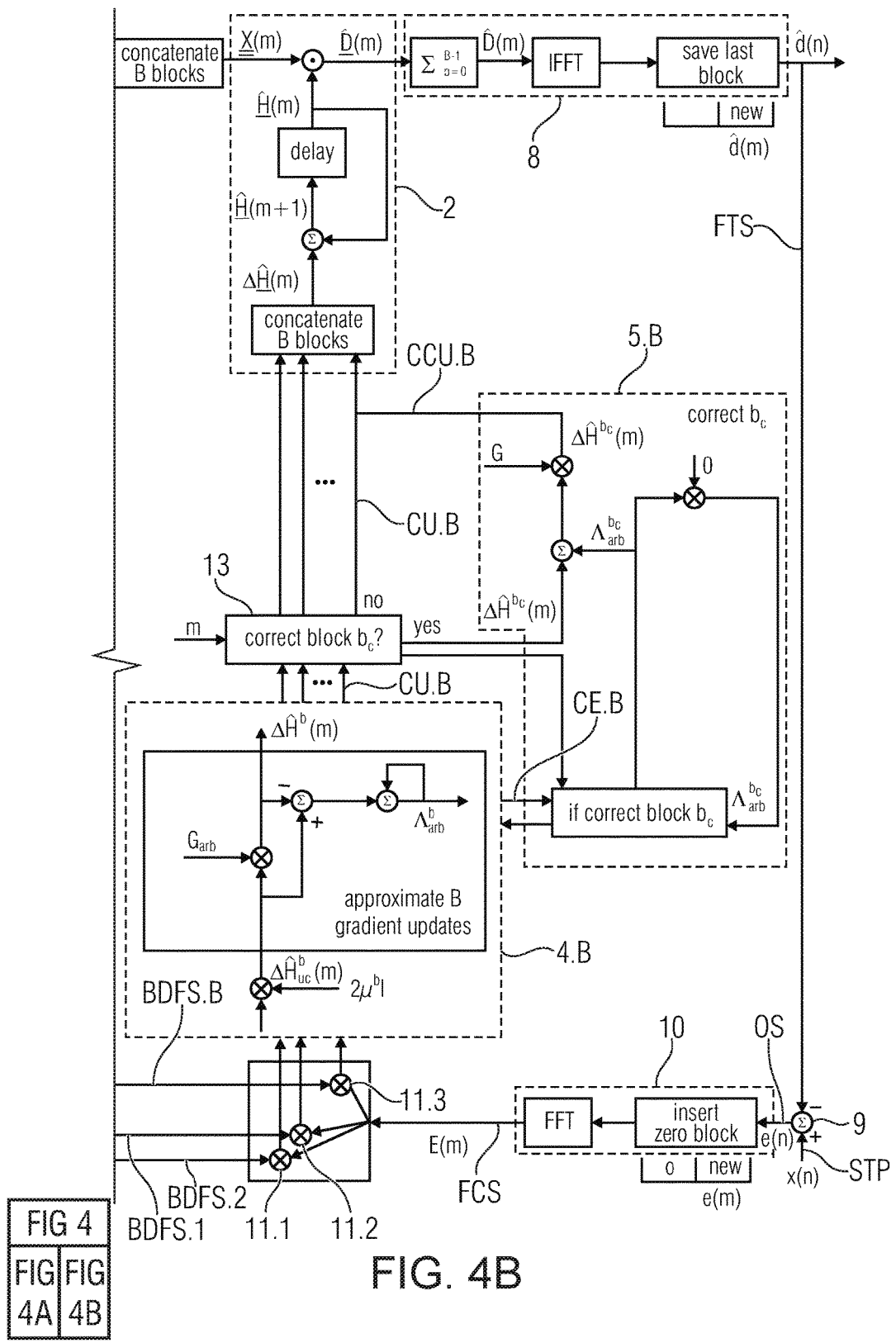

FIG. 4 illustrates a second embodiment of a partitioned block frequency domain filter device according to the invention in a schematic view. For the sake of convenience only the adaptation module 4.B and the correction module 5.B are shown.

In the following, the invention is described. The proposed method is applied in two steps, as the alternated constraining method, and uses an arbitrary simplification of the constraining matrix, in the following denoted as arbitrary constraining window $G_{arb}$, to reduce the wrap-around components during adaptation. Moreover, it is flexible in terms of the overlap between frames and the design of the constraining window approximation—it is valid for any constraining window approximation. In addition, the frame interval between corrections, P, can be selected differently for each block, which will be denoted as $P_b$, as the correction step depends only on the past states of the corrected block and not on the adjacent blocks. To start with (18b) can be reformulated as $$\hat{H}^{bc}(m+1) = G(\hat{H}^{bc}(m) + \Delta \hat{H}^{bc}_{uc}(m)) = \quad (20)$$
$$G\left(\hat{H}^{bc}(m - P_b B + 1) + \sum_{p=0}^{P_b B - 1} \Delta \hat{H}^{bc}_{uc}(m - p)\right)$$

which highlights the fact that between corrections the gradient updates are accumulated. Hereafter, if an arbitrary approximation of the constraining matrix, $G_{arb}$, is applied during adaptation, the corrected filter update is defined by, $$\hat{H}^{bc}(m+1) = G\left(\hat{H}^{bc}(m - P_b B + 1) + \sum_{p=0}^{P_b B - 1} G_{arb} \Delta(\hat{H})^{bc}_{uc}(m - p)\right) \quad (21)$$

By doing this an error is introduced per frame and block on the linear correlation components, which has to be compensated before the correction step, i.e.

$$\hat{H}^{bc}(m+1) = G\left(\hat{H}^{bc}(m - P_b B + 1) + \sum_{p=0}^{P_b B - 1} G_{arb} \Delta \hat{H}^{bc}_{uc}(m - p) + \Lambda^{bc}_{arb}\right). \quad (22)$$

Hence, by equating (20) and (21), the compensation factor $\Lambda_{arb}^{bc}$ is obtained.

$$\sum_{p=0}^{P_b B - 1} \Delta \hat{H}^{bc}_{uc}(m - p) = \sum_{p=0}^{P_b B - 1} G_{arb} \Delta \hat{H}^{bc}_{uc}(m - p) + \Lambda^{bc}_{arb} \quad (23a)$$

$$\Lambda^{bc}_{arb} = \sum_{p=0}^{P_b B - 1} \left(\Delta \hat{H}^{bc}_{uc}(m - p) - G_{arb} \Delta \hat{H}^{bc}_{uc}(m - p)\right). \quad (23b)$$

Thus, $\Lambda_{arb}^{bc}$ can be interpreted as the cumulative error introduced on the unconstrained gradient update by applying an approximated constraining matrix. The proposed method is summarized in Table 2.

The procedure is as follows. First, an arbitrary approximation of the constraining window in the frequency domain is used, to enhance the adaptation process, and the cumulative difference $\Lambda_{arb}^{bc}$, is updated. Afterwards, for example every $P_b$ frames, $\Lambda_{arb}^{bc}$ is used to reconstruct the unconstrained filter update, prior to eliminating the wrap-around components. Finally, the cumulative difference is reset to zero. Hereafter, the linear components are perfectly corrected using only the error introduced on the to-be-corrected block, $b_c$, in the past. Thus, the implementation of the proposed constraining method can be easily parallelized. Table 2 provides a pseudo code for the implementation of the adaptation sequence and the correction sequence according to the invention. The constraining method according to the invention may also be called enhanced alternated constraining method.

TABLE 2

Enhanced alternated constraining method for b = 0 : B − 1:
   $\hat{H}^b(m + 1) = \hat{H}^b(m) + G_{arb}\Delta\hat{H}_{uc}^b(m)$
   $\Lambda_{arb}^b = \Lambda_{arb}^b + \Delta\hat{H}_{uc}^b(m) - G_{arb}\Delta\hat{H}_{uc}^b(m)$
if $((m/P_b))_B = b_c$:
   $\hat{H}^{bc}(m + 1) = G(\hat{H}^{bc}(m + 1) + \Lambda_{arb}^{bc})$
   $\Lambda_{arb}^{bc} = 0$ FIG. 5 illustrates a constraining operation according to the invention in a schematic view. Although the adaptation sequence AS and the correction sequence CS are both executed in the frequency domain, the graphs show the equivalent windowing elements in the time domain.

The proposed method is schematically depicted for one block in FIG. 5, with $G_{arb}=G_s$ and 50% frame overlap (block overlap in time domain). The selection of the constraining window and $P_b$ will, of course, influence the performance of the adaptive algorithm and the final algorithmic complexity.

The design of the constraining window approximation can be done flexibly. For example, a limited number T of pairs of off-diagonals of G can be taken into account. By doing this, the time domain counterpart could become negative. This can be avoided, if desired, by adding an offset to the time domain window, and modifying $G_{arb}$ accordingly. Another possibility is to design a window in the time domain, and use its frequency domain counterpart.

FIGS. 6A and 6B provides examples of time domain constraining windows corresponding to different constraining matrices, wherein a window overlap of 50% is assumed.

FIGS. 7A and 7B provides examples of time domain constraining windows corresponding to different constraining matrices, wherein a window overlap of 75% is assumed.

FIGS. 6A and 7A depict the approximated windows obtained by taking a limited number of off-diagonals of G into account, which is equivalent to taking the inter-band correlations into account. FIGS. 6B and 7B depict extensions of $G_s$, as defined in (19), adding T−1 pairs of off-diagonals to $G_s$. For clarity, it may be mentioned that $G_s^2$ stands for $(G_s)^2$.

The complexity introduced by the application of these windows is proportional to the number of pairs of off-diagonals T, used for the design of $G_{arb}$. Moreover, the lowest complexity is obtained if the values on the off-diagonals are real or purely imaginary. Finally, the proposed method is not only flexible with respect to the approximation of the windows and the overlap between frames, but in addition, for a fixed overlap, $G_{arb}$ can be modified on-line. This can be desirable if a certain performance is reached, if there is a sudden need to further reduce the complexity—for example if the device used enters an energy saving mode—or if the adaptive filtering process has to be reinitialized, for example due to the detection of an echo path change.

Figure 8:
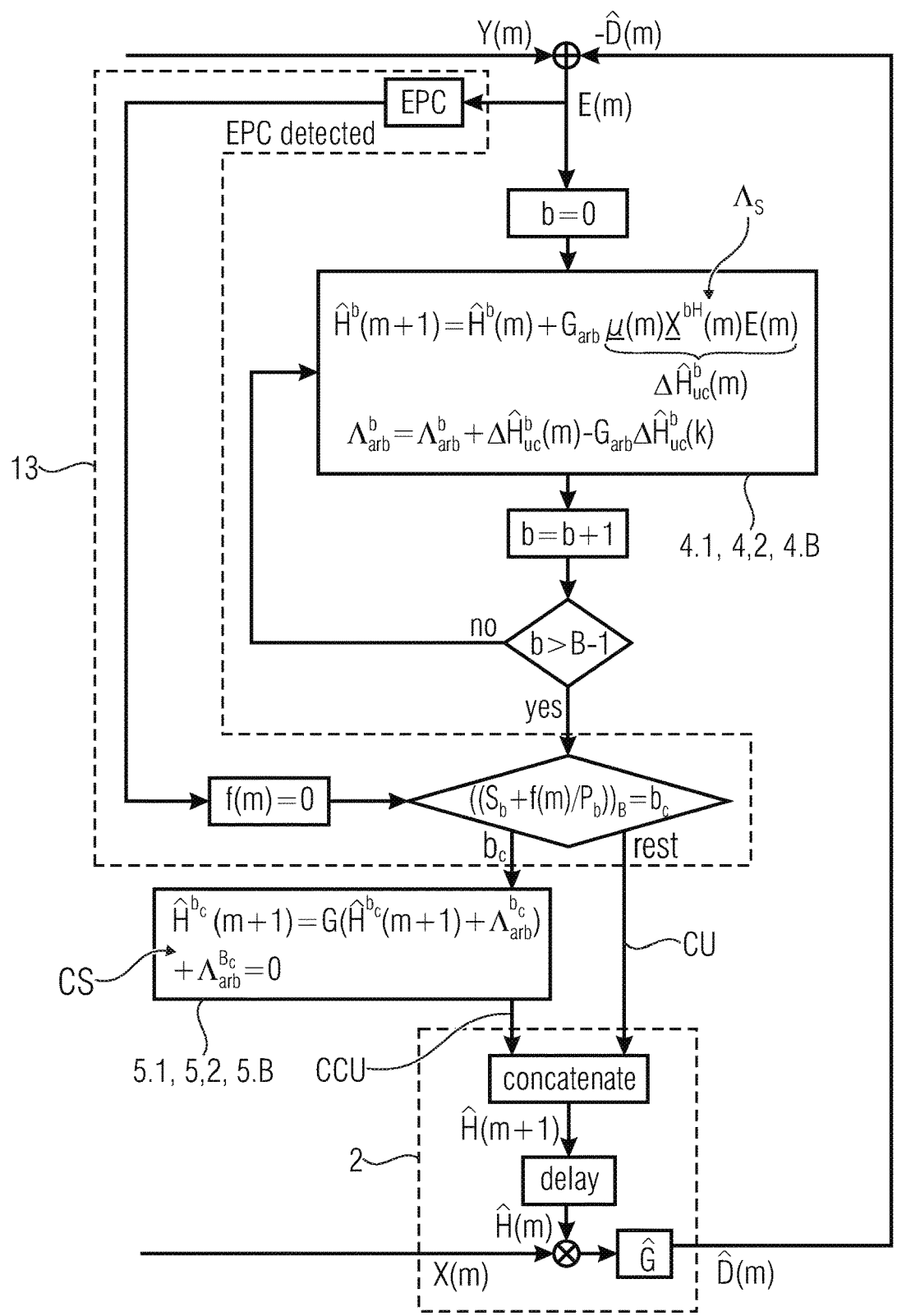
FIG. 8 shows a principle of operation of a first embodiment of a correction sequence control module in the form of a block diagram.

FIG. 8 shows a principle of operation of a first embodiment of a correction sequence control module in the form of a block diagram.

It should be mentioned that the order and the frequency in which the blocks are corrected can be designed flexibly, and can be modified on-line. Consequently, one embodiment of the present invention is proposed with the gradient update procedure AS and correction procedure CS as described in Table 3 and depicted in FIG. 8.

TABLE 3

Figure 10:
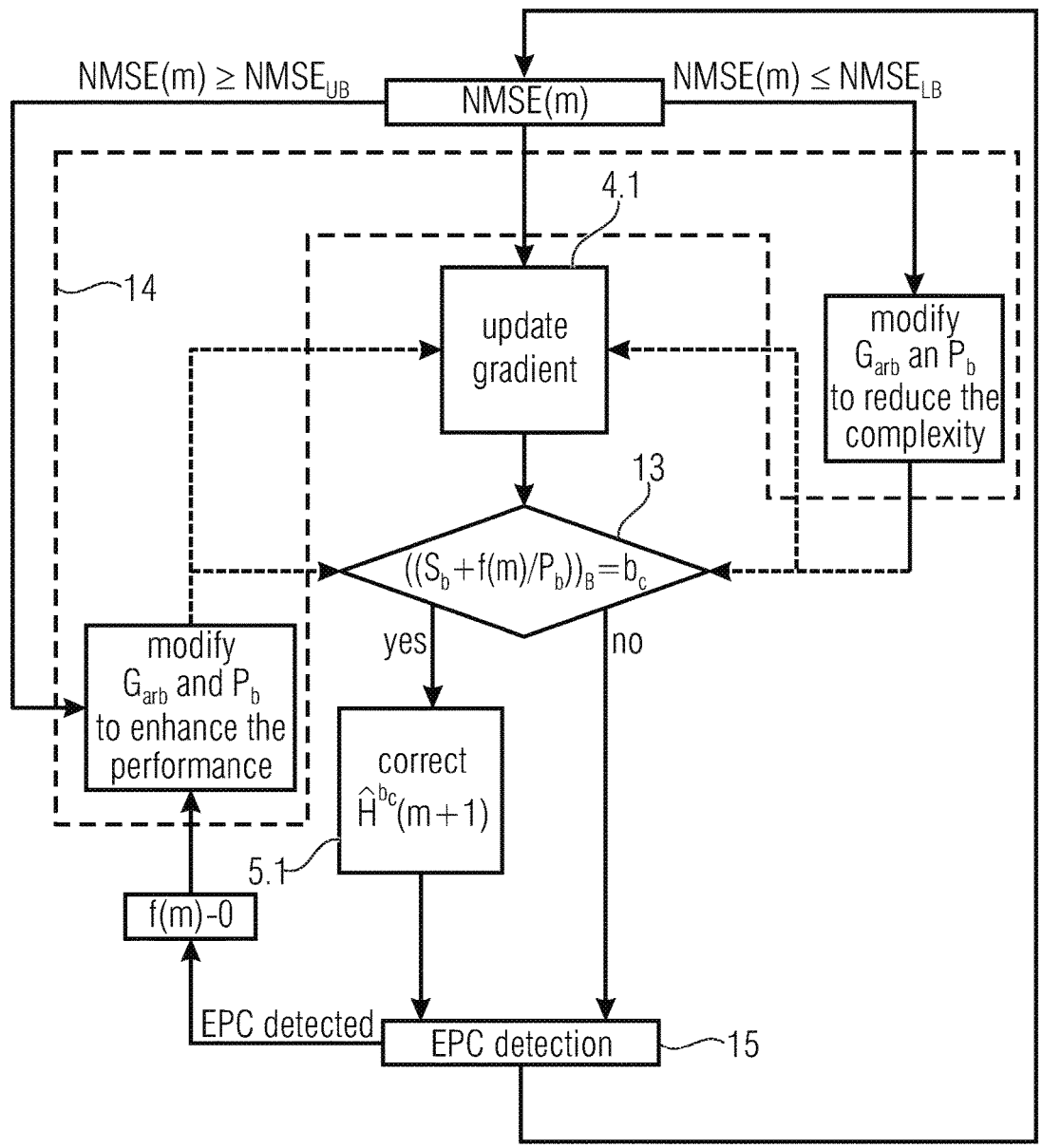
FIG. 10 shows a principle of operation of a second embodiment of a correction sequence control module in the form of a block diagram.
Figure 11:
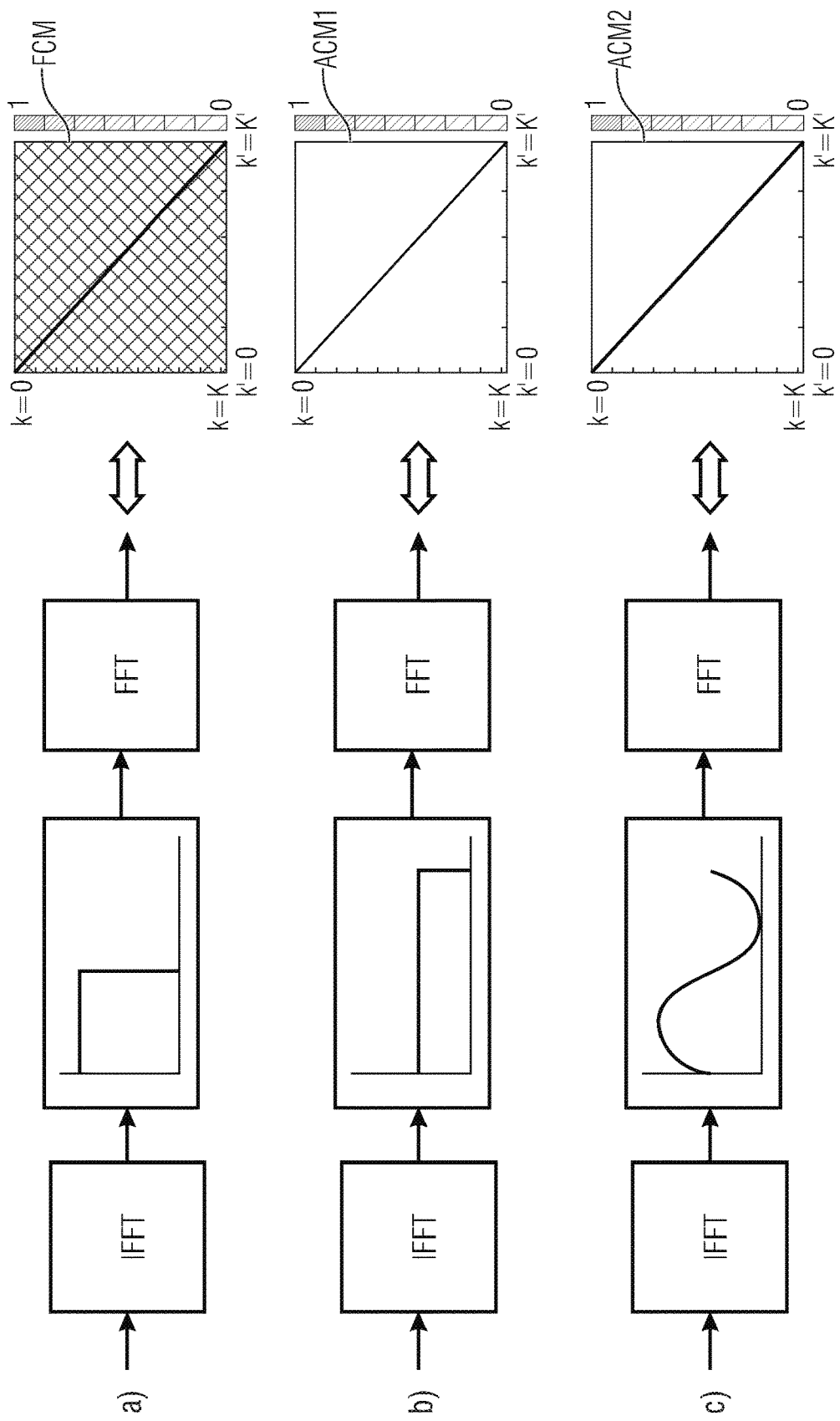
FIG. 11 provides examples of time domain windows and their corresponding constraining matrices in frequency domain.

Controlled implementation of the EAC method for b = 0 : B − 1:
　　$\hat{H}^b(m + 1) = \hat{H}^b(m) + G_{arb}\Delta\hat{H}_{uc}^b(m)$
　　$\Lambda_{arb}^b = \Lambda_{arb}^b + \Delta\hat{H}_{uc}^b(m) - G_{arb}\Delta\hat{H}_{uc}^b(m)$
　　if $((S_b + f(m)/P_b))_B = b_c$:
　　　　$\hat{H}^{bc}(m + 1) = G(\hat{H}^{bc}(m + 1) + \Lambda_{arb}^{bc})$
　　　　$\Lambda_{arb}^{bc} = 0$ Hereafter the decision on whether a block and which block has to be corrected is given by $((S_b+f(m)/P_b))_B=b_c$, with $b_c=(0, 1, \ldots, B-1)$; where $S_b$ is an offset factor which determines the order in which the corrections start, and f(m) is a counter function. The counter function can be controlled or reset by, for instance, the output of an echo path change (EPC) detector, see for example M. A. Iqbal and S. L. Grant, "A novel normalized cross-correlation based echo-path change detector," in 2007 IEEE Region 5 Conference, Fayetteville, Ark., pp. 249-251, April 2007; hereinafter referred to as "reference [11]", as depicted in FIG. 10, or based on a measure of the error signal, for instance, the normalized mean squared error (NMSE). As already mentioned, $P_b$ determines the frequency in which each block is corrected. Some possible schemes for the correction intervals, for $S_b=0 \forall b$, are depicted in FIG. 11.

Figure 9:
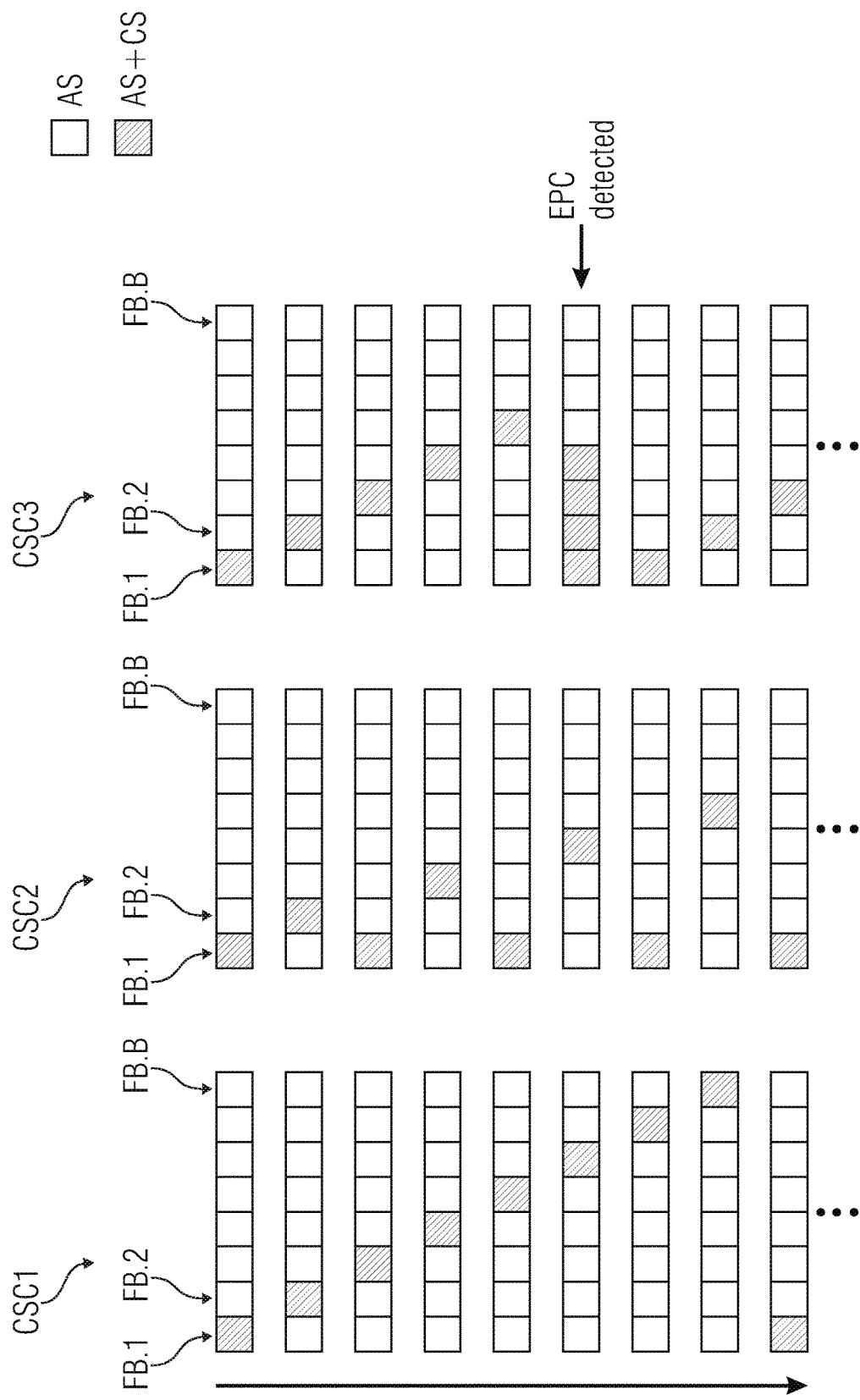
FIG. 9 provides examples of correction schemes.

FIG. 9 provides examples of correction schemes CSC.

According to an advantageous embodiment of the invention the correction sequence control module 13 is configured for deciding whether and at which of the filter update blocks 3.1, 3.2, 3.B the correction sequence CS is applied based on the cumulative errors of the filter update blocks 3.1, 3.2, 3.B.

According to an advantageous embodiment of the invention the correction sequence control module 13 comprises a correction scheme CSC defining for each of the filter update blocks 3.1, 3.2, 3.B a number of adaptation sequences AS after which the correction sequence CS is applied at the respective filter partition 3.1, 3.2, 3.B.

According to an advantageous embodiment of the invention for each of the filter update blocks 3.1, 3.2, 3.B the number of adaptation sequences AS after which the correction sequence CS is applied at the respective filter partition 3.1, 3.2, 3.B is diminished in response to a change of the frequency domain control signal FCS which exceeds a threshold.

According to an advantageous embodiment of the invention for each of the filter update blocks 3.1, 3.2, 3.B the number of adaptation sequences AS after which the correction sequence CS is applied at the respective filter partition 3.1, 3.2, 3.B is dynamically adapted based on a measure of the frequency domain control signal FCS.

The order in which the blocks are corrected can be designed flexibly, for example based on the energy of the cumulative difference of each block, i.e., $\Lambda_{arb}^b$. It may be noted that the higher the energy of the cumulative difference of one block, the bigger the error introduced on the linear components. Hereafter, a gain in the performance can be obtained by correcting first the blocks FB.1, FB.2, FB.B with the highest cumulative differences.

FIG. 10 shows a principle of operation of a second embodiment of a correction sequence control module in the form of a block diagram.

According to an advantageous embodiment of the invention the partitioned block frequency domain adaptive filter device 1 comprises an approximated constraining matrix update module 14 configured for dynamically adapting the complexity of the arbitrary constraining matrix.

According to an advantageous embodiment of the invention the approximated constraining matrix update module 14 is configured for dynamically adapting the complexity of the approximated constraining matrix ACM depending on a measure of the frequency domain control signal FCS.

According to an advantageous embodiment of the invention the approximated constraining matrix update module 14 is configured for enlarging the complexity of the approximated constraining matrix ACM in response to a change of the frequency domain control signal FCS which exceeds a threshold.

It may be stressed that for the proposed method neither the approximation of the constraining window nor the frame overlap are specified, as they can be arbitrarily designed. Moreover, it is even possible to use different approximations of the constraining matrices and frame intervals between correction sequences CS for each block FB.1, FB.2, FB.B (number of adaptation sequences AS after which the correction sequence CS is applied at the respective filter block). These parameters can be modified on-line depending, for example, on an echo path change detector 16 (EPC detector) or on a measure of the frequency domain control signal FCS, as for example the normalized mean squared error (NMSE), as depicted in FIG. 12.

The inventive provides flexibility in terms of nearly all the design parameters, i.e., the approximated constraining matrix ACM, frame overlap, order of the corrections and different interval between corrections for each block. Moreover, for a fixed frame overlap, all the other design parameters can be modified on-line without having to reinitialize the adaptive algorithm. This enables to control the trade-off between the algorithmic complexity and the convergence speed of the PBFDAF device. However, the algorithmic complexity will highly depend on both the design of the approximated constraining matrix ACM and the correction scheme for each block.

FIG. 11 provides examples of time domain windows and their corresponding constraining matrices in frequency domain. FIG. 11 (a) illustrates the constraining matrix FCM, whereas FIG. 11 (b) and FIG. 11 (c) each illustrate an approximated constraining matrix ACM having a lesser complexity than the constraining matrix FCM. The grey scale values correspond to the values of the elements of the respective matrix.

Figure 12:
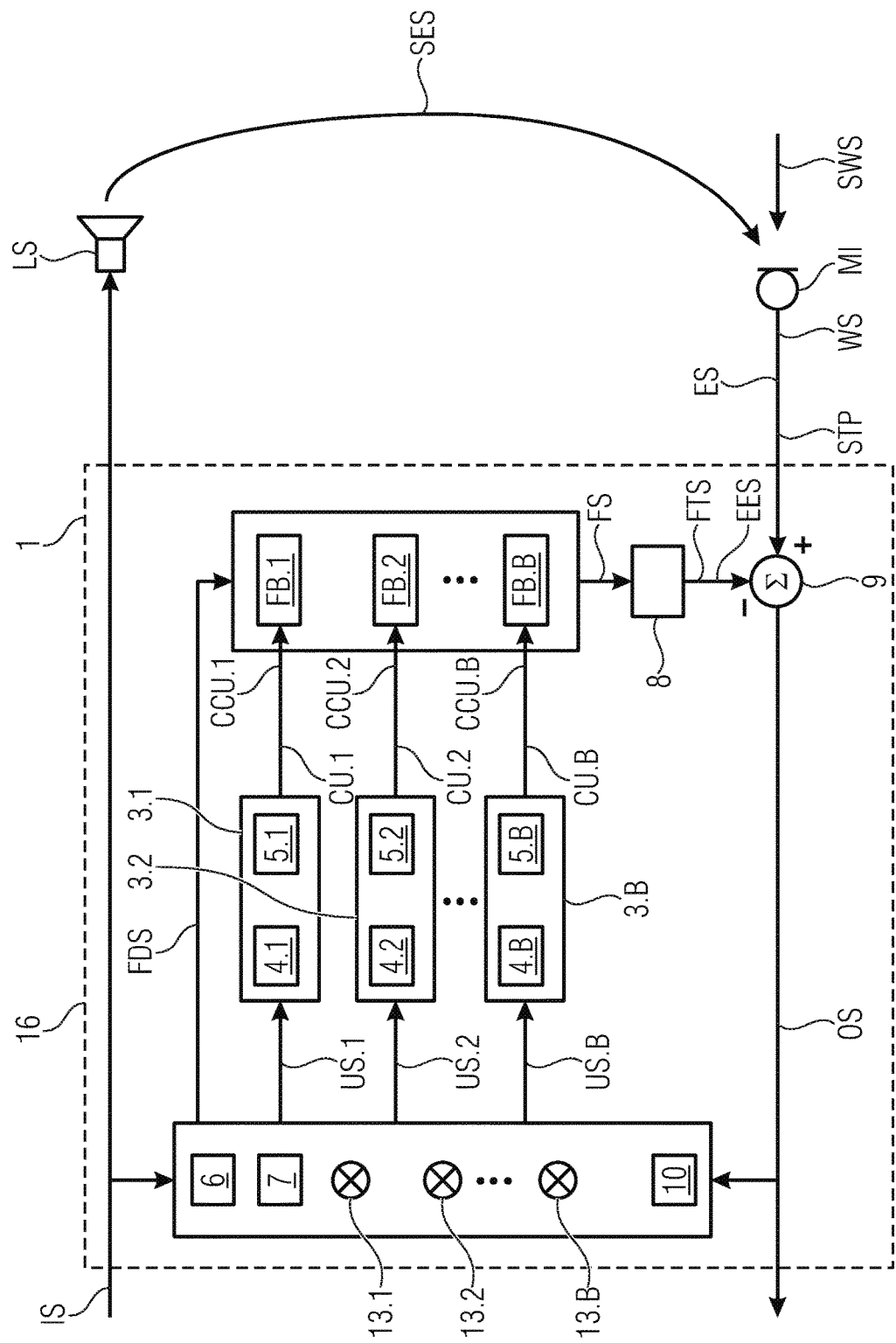
FIG. 12 illustrates a first embodiment of a device for cancelling an echo signal of a time domain input signal according to the invention in a schematic view.

FIG. 12 illustrates a first embodiment of a device for cancelling an echo signal of a time domain input signal according to the invention in a schematic view. The device 16 comprises a partitioned block frequency domain adaptive filter device 1, the partitioned block frequency domain adaptive filter device 1 comprising: a frequency domain adaptive filter 2 configured for filtering a frequency domain representation signal FDS of the time domain input signal IS depending on a set of filter coefficients consisting of a plurality of blocks FB.1, FB.2, FB.B of filter coefficients in order to produce a filtered signal FS; a frequency domain to time domain converter 8 configured for converting the filtered signal FS into an estimated echo signal EES representing an estimation of the echo signal ES in time domain; a subtraction module 9 for producing an output signal OS by subtracting the estimated echo signal EES from a signal-to-be-processed STP comprising the echo signal ES; a plurality of parallel arranged filter update blocks 3.1, 3.2, 3.B, each of the filter update blocks 3.1, 3.2, 3.B being configured for updating one of the blocks FB.1, FB.2, FB.B of filter coefficients based on an update signal US.1, US.2, US.B gathered by a circular correlation of a block BFDS.1, BFDS.2, BFDS.B of the frequency domain representation signal FDS and a frequency domain control signal FCS comprising a representation of the filtered signal FS; wherein each of the filter update blocks 3.1, 3.2, 3.B comprises an adaptation module 4.1, 4.2, 4.B configured for executing an adaptation sequence AS comprising the steps of calculating an approximation of a constrained gradient update CU.1, CU.2, CU.B for the filter coefficients of the respective block FB.1, FB.2, FB.B of filter coefficients by applying an approximated constraining matrix ACM having a lesser complexity than a constraining matrix FCM to an unconstrained gradient update for the filter coefficients of the respective block of filter coefficients, wherein the unconstrained gradient update is derived from the update signal US.1, US.2, US.B, and calculating a cumulative error CE.1, CE.2, CE.B introduced on the unconstrained gradient by applying the approximated constraining matrix ACM to the unconstrained gradient update; wherein each of the filter update blocks 3.1, 3.2, 3.B comprises a correction module 5.1, 5.2, 5.B configured for executing a correction sequence CS comprising the steps of calculating a corrected constrained gradient update CCU.1, CCU.2, CCU.B for the filter coefficients of the respective block FB.1, FB.2, FB.B of filter coefficients by applying the frequency domain constraining matrix FCM to a sum of the approximation of the constrained gradient update CU.1, CU.2, CU.B and the cumulative error CE.1, CE.2, CE.B.

The partitioned block frequency domain adaptive filter device 1 of FIG. 12 is equivalent to the partitioned block frequency domain adaptive filter device 1 discussed above. In the example of FIG. 12 an echo sound signal SES, which may comprise far end speech, is produced by a loudspeaker LS to which the input signal IS is fed. A microphone MI acquires the echo sound signal SES as a well as a wanted sound signal SWS, which may comprise near end speech and background noise, so that the signal-to-be-processed STP comprises an echo signal ES based on the echo sound signal SES and of a wanted signal WS based on the wanted so signal SWS. As the estimated echo signal EES is subtracted from the signal-to-be-processed STP, the echo signal ES is effectively canceled in the output signal OS.

With respect to the devices and the methods of the described embodiments the following shall be mentioned:

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, which is stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may be configured, for example, to be transferred via a data communication connection, for example via the Internet.

A further embodiment comprises a processing means, for example a computer, or a programmable logic device, in particular a processor comprising hardware, configured or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A partitioned block frequency domain adaptive filter device comprising:
   a frequency domain adaptive filter configured for filtering a frequency domain representation of a time domain input signal depending on a set of filter coefficients comprising a plurality of blocks of filter coefficients in order to produce a filtered signal;
   a plurality of parallel arranged filter update blocks, each of the filter update blocks being configured for updating one of the blocks of filter coefficients based on an update signal gathered by a circular correlation of a block of the frequency domain representation signal and a frequency domain control signal comprising a representation of the filtered signal;
   wherein each of the filter update blocks comprises an adaptation module configured for executing an adaptation sequence comprising:
   calculating an approximation of a constrained gradient update for the filter coefficients of the respective block of filter coefficients by applying an approximated constraining matrix exhibiting a lesser complexity than a constraining matrix to an unconstrained gradient update for the filter coefficients of the respective block of filter coefficients, wherein the unconstrained gradient update is derived from the update signal, and
   calculating a cumulative error introduced on the unconstrained gradient update by applying the approximated constraining matrix to the unconstrained gradient update;
   wherein each of the filter update blocks comprises a correction module configured for executing a correction sequence comprising:
   calculating a corrected constrained gradient update for the filter coefficients of the respective block of filter coefficients by applying the constraining matrix to a sum of the approximation of the constrained gradient update and the cumulative error.

2. The partitioned block frequency domain adaptive filter device according to claim 1, wherein the partitioned block frequency domain adaptive filter device comprises a correction sequence control module configured for deciding whether and at which of the filter update blocks the correction sequence is applied after executing the adaptation sequence.

3. The partitioned block frequency domain adaptive filter device according to claim 2, wherein the correction sequence control module is configured for deciding whether and at which of the filter update blocks the correction sequence is applied based on the cumulative errors of the filter update blocks.

4. The partitioned block frequency domain adaptive filter device according to claim 2, wherein the correction sequence control module comprises a correction scheme defining for each of the filter update blocks a number of adaptation sequences after which the correction sequence is applied at the respective filter partition.

5. The partitioned block frequency domain adaptive filter device according to claim 4, wherein for each of the filter update blocks the number of adaptation sequences after which the correction sequence is applied at the respective filter block is diminished in response to a change of the frequency domain control signal which exceeds a threshold.

6. The partitioned block frequency domain adaptive filter device according to claim 4, wherein for each of the filter update blocks the number of adaptation sequences after which the correction sequence is applied at the respective filter block is dynamically adapted based on a measure of the frequency domain control signal.

7. The partitioned block frequency domain adaptive filter device according to claim 1, wherein the partitioned block frequency domain adaptive filter device comprises an approximated constraining matrix update module configured for dynamically adapting the complexity of the approximated constraining matrix.

8. The partitioned block frequency domain adaptive filter device according to claim 7, wherein the approximated constraining matrix update module is configured for dynamically adapting the complexity of the approximated constraining matrix depending on a measure of the frequency domain control signal.

9. The partitioned block frequency domain adaptive filter device according to claim 7, wherein the approximated constraining matrix update module is configured for enlarging the complexity of the approximated constraining matrix in response to a change of the frequency domain control signal which exceeds a threshold.

10. A device for cancelling an echo signal of a time domain input signal, the device comprising a partitioned block frequency domain adaptive filter device, the partitioned block frequency domain adaptive filter device comprising:
   a frequency domain adaptive filter configured for filtering a frequency domain representation of the time domain input signal depending on a set of filter coefficients comprising a plurality of blocks of filter coefficients in order to produce a filtered signal;
   a frequency domain to time domain converter configured for converting the filtered signal into an estimated echo signal representing an estimation of the echo signal in time domain;
   a subtraction module for producing an output signal by subtracting the estimated echo signal from a signal-to-be-processed comprising the echo signal;
   a plurality of parallel arranged filter update blocks, each of the filter update blocks being configured for updating one of the blocks of filter coefficients based on an update signal gathered by a circular correlation of a block of the frequency domain representation signal and a frequency domain control signal comprising a representation of the filtered signal;
   wherein each of the filter update blocks comprises an adaptation module configured for executing an adaptation sequence comprising:

calculating an approximation of a constrained gradient update for the filter coefficients of the respective block of filter coefficients by applying an approximated constraining matrix exhibiting a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update;

wherein each of the filter update blocks comprises a correction module configured for executing a correction sequence comprising:

calculating a corrected constrained gradient update for the filter coefficients of the respective block of filter coefficients by applying the constraining matrix to a sum of the approximation of the constrained gradient update and the cumulative error.

11. An adaptive filtering method comprising:

using a frequency domain adaptive filter for filtering a frequency domain representation of a time domain input signal depending on a set of filter coefficients comprising a plurality of blocks of filter coefficients in order to produce a filtered signal;

using each filter update block of a plurality of parallel arranged filter update blocks for updating one of the blocks of filter coefficients based on an update signal gathered by a circular correlation of a block of the frequency domain representation signal and a frequency domain control signal comprising a representation of the filtered signal;

executing an adaptation sequence for each of the filter update blocks by using an adaptation module of the respective filter update block, the adaptation sequence comprising:

calculating an approximation of the constrained gradient update for the filter coefficients of the respective block of filter coefficients by applying an approximated constraining matrix exhibiting a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update;

executing a correction sequence for each of the filter update blocks by using a correction module of the respective filter update block, the correction sequence comprising:

calculating a corrected constrained gradient update for the filter coefficients of the respective block of filter coefficients by applying the frequency domain constraining matrix to a sum of the approximation of the constrained gradient update and the cumulative error.

12. A non-transitory digital storage medium having a computer program stored thereon to perform the adaptive filtering method comprising:

using a frequency domain adaptive filter for filtering a frequency domain representation of a time domain input signal depending on a set of filter coefficients comprising a plurality of blocks of filter coefficients in order to produce a filtered signal;

using each filter update block of a plurality of parallel arranged filter update blocks for updating one of the blocks of filter coefficients based on an update signal gathered by a circular correlation of a block of the frequency domain representation signal and a frequency domain control signal comprising a representation of the filtered signal;

executing an adaptation sequence for each of the filter update blocks by using an adaptation module of the respective filter update block, the adaptation sequence comprising:

calculating an approximation of the constrained gradient update for the filter coefficients of the respective block of filter coefficients by applying an approximated constraining matrix exhibiting a lesser complexity than a constraining matrix to an unconstrained gradient update for the filter coefficients of the respective block of filter coefficients, wherein the unconstrained gradient update is derived from the update signal, and calculating a cumulative error introduced on the unconstrained gradient by applying the approximated constraining matrix to the unconstrained gradient update;

executing a correction sequence for each of the filter update blocks by using a correction module of the respective filter update block, the correction sequence comprising:

calculating a corrected constrained gradient update for the filter coefficients of the respective block of filter coefficients by applying the frequency domain constraining matrix to a sum of the approximation of the constrained gradient update and the cumulative error, when said computer program is run by a computer.

* * * * *